(12) United States Patent
Abra et al.

(10) Patent No.: US 11,545,927 B2
(45) Date of Patent: Jan. 3, 2023

(54) THREE-DIMENSIONAL LAMINATE PHOTOVOLTAIC MODULE

(71) Applicant: GAF Energy LLC, Parsippany, NJ (US)

(72) Inventors: Lewis Abra, San Francisco, CA (US); Nate Peterson, Dallas, TX (US); Thierry Nguyen, San Francisco, CA (US); Richard Perkins, San Jose, CA (US)

(73) Assignee: GAF Energy LLC, Parsippany, NJ (US)

( * ) Notice: Subject to any disclaimer, the term of this patent is extended or adjusted under 35 U.S.C. 154(b) by 0 days.

(21) Appl. No.: 17/223,830

(22) Filed: Apr. 6, 2021

(65) Prior Publication Data

US 2021/0320615 A1 Oct. 14, 2021

Related U.S. Application Data

(60) Provisional application No. 63/117,172, filed on Nov. 23, 2020, provisional application No. 63/035,470, (Continued)

(51) Int. Cl.
*H02S 20/23* (2014.01)
*H02S 40/36* (2014.01)
*H02S 30/10* (2014.01)

(52) U.S. Cl.
CPC ............. *H02S 20/23* (2014.12); *H02S 30/10* (2014.12); *H02S 40/36* (2014.12)

(58) Field of Classification Search
CPC ....... H01L 31/00–078; Y02E 10/50–60; H02S 20/00–32; H02S 30/00–20; H02S 40/00–44
(Continued)

(56) References Cited

U.S. PATENT DOCUMENTS 1,981,467 A 11/1934 Radtke
3,156,497 A 11/1964 Lessard
(Continued)

FOREIGN PATENT DOCUMENTS

CA 2829440 C 5/2019
CH 700095 A2 6/2010
(Continued)

OTHER PUBLICATIONS

JP2017027735 English translation (Year: 2017).*
(Continued)

*Primary Examiner* — Bach T Dinh
(74) *Attorney, Agent, or Firm* — Greenberg Traurig, LLP

(57) ABSTRACT

A system includes a first photovoltaic module and a second photovoltaic module, each having a first end, an opposite second end, a first side extending from the first end to the second end, a second side opposite the first side and extending from the first end to the second end, a first surface and a second surface opposite the first surface, at least one solar cell, an encapsulant encapsulating the at least one solar cell, and a frontsheet juxtaposed with a first surface of the encapsulant. A second surface of the first photovoltaic module proximate to a second side thereof is attached to the first surface of the second photovoltaic module proximate to the first side thereof. A second surface of the first photovoltaic module proximate to a second end thereof is attached to the first surface of the second photovoltaic module proximate to the first end thereof.

7 Claims, 15 Drawing Sheets

Related U.S. Application Data filed on Jun. 5, 2020, provisional application No. 63/007,570, filed on Apr. 9, 2020.

(58) Field of Classification Search
USPC .................................................. 136/243–265
See application file for complete search history.

(56) References Cited

U.S. PATENT DOCUMENTS

| | | | |
|---|---|---|---|
| 4,258,948 A | 3/1981 | Hoffmann | |
| 4,349,220 A | 9/1982 | Carroll et al. | |
| 4,499,702 A | 2/1985 | Turner | |
| 4,636,577 A | 1/1987 | Peterpaul | |
| 5,167,579 A | 12/1992 | Rotter | |
| 5,590,495 A * | 1/1997 | Bressler | H02S 40/22 52/173.3 |
| 5,642,596 A | 7/1997 | Waddington | |
| 6,008,450 A | 12/1999 | Ohtsuka et al. | |
| 6,046,399 A | 4/2000 | Kapner | |
| 6,156,967 A * | 12/2000 | Ralph | H01L 31/041 136/244 |
| 6,320,114 B1 * | 11/2001 | Kuechler | H01L 31/043 136/245 |
| 6,336,304 B1 | 1/2002 | Mimura et al. | |
| 6,341,454 B1 | 1/2002 | Koleoglou | |
| 6,407,329 B1 | 6/2002 | Iino et al. | |
| 6,576,830 B2 | 6/2003 | Nagao et al. | |
| 6,928,781 B2 | 8/2005 | Desbois et al. | |
| 6,972,367 B2 | 12/2005 | Federspiel et al. | |
| 7,138,579 B2 | 11/2006 | Megason et al. | |
| 7,155,870 B2 | 1/2007 | Almy | |
| 7,178,295 B2 | 2/2007 | Dinwoodie | |
| 7,328,534 B2 | 2/2008 | Dinwoodie | |
| 7,487,771 B1 | 2/2009 | Eiffert et al. | |
| 7,587,864 B2 | 9/2009 | McCaskill et al. | |
| 7,678,990 B2 | 3/2010 | McCaskill et al. | |
| 7,678,991 B2 | 3/2010 | McCaskill et al. | |
| 7,748,191 B2 | 7/2010 | Podirsky | |
| 7,819,114 B2 | 10/2010 | Augenbraun et al. | |
| 7,824,191 B1 | 11/2010 | Browder | |
| 7,832,176 B2 | 11/2010 | McCaskill et al. | |
| 8,118,109 B1 | 2/2012 | Hacker | |
| 8,168,880 B2 | 5/2012 | Jacobs et al. | |
| 8,173,889 B2 | 5/2012 | Kalkanoglu et al. | |
| 8,210,570 B1 | 7/2012 | Railkar et al. | |
| 8,276,329 B2 | 10/2012 | Lenox | |
| 8,309,840 B2 | 11/2012 | Stevens et al. | |
| 8,312,693 B2 | 11/2012 | Cappelli | |
| 8,319,093 B2 | 11/2012 | Kalkanoglu et al. | |
| 8,333,040 B2 | 12/2012 | Shiao et al. | |
| 8,371,076 B2 | 2/2013 | Jones et al. | |
| 8,375,653 B2 | 2/2013 | Shiao et al. | |
| 8,404,967 B2 | 3/2013 | Kalkanoglu et al. | |
| 8,438,796 B2 | 3/2013 | Shiao et al. | |
| 8,410,349 B2 | 4/2013 | Kalkanoglu et al. | |
| 8,418,415 B2 | 4/2013 | Shiao et al. | |
| 8,468,754 B2 | 6/2013 | Railkar et al. | |
| 8,468,757 B2 | 6/2013 | Krause et al. | |
| 8,505,249 B2 | 8/2013 | Geary | |
| 8,512,866 B2 | 8/2013 | Taylor | |
| 8,513,517 B2 | 8/2013 | Kalkanoglu et al. | |
| 8,586,856 B2 | 11/2013 | Kalkanoglu et al. | |
| 8,601,754 B2 | 12/2013 | Jenkins et al. | |
| 8,629,578 B2 | 1/2014 | Kurs et al. | |
| 8,646,228 B2 | 2/2014 | Jenkins | |
| 8,656,657 B2 | 2/2014 | Livsey et al. | |
| 8,671,630 B2 | 3/2014 | Lena et al. | |
| 8,677,702 B2 | 3/2014 | Jenkins | |
| 8,695,289 B2 | 4/2014 | Koch et al. | |
| 8,713,858 B1 | 5/2014 | Xie | |
| 8,713,860 B2 | 5/2014 | Railkar et al. | |
| 8,793,940 B2 | 5/2014 | Kalkanoglu et al. | |
| 8,789,321 B2 | 7/2014 | Ishida | |
| 8,793,941 B2 | 8/2014 | Bosler et al. | |
| 8,826,607 B2 | 9/2014 | Shiao et al. | |
| 8,835,751 B2 | 9/2014 | Kalkanoglu et al. | |
| 8,863,451 B2 | 10/2014 | Jenkins et al. | |
| 8,893,940 B2 | 11/2014 | Green et al. | |
| 8,898,970 B2 | 12/2014 | Jenkins et al. | |
| 8,925,262 B2 | 1/2015 | Railkar et al. | |
| 8,943,766 B2 | 2/2015 | Gombarick et al. | |
| 8,946,544 B2 | 2/2015 | Jacobs et al. | |
| 8,950,128 B2 | 2/2015 | Kalkanoglu et al. | |
| 8,959,848 B2 | 2/2015 | Jenkins et al. | |
| 8,966,838 B2 | 3/2015 | Jenkins | |
| 8,966,850 B2 | 3/2015 | Jenkins et al. | |
| 8,994,224 B2 | 3/2015 | Mehta et al. | |
| 9,032,672 B2 | 5/2015 | Livsey et al. | |
| 9,166,087 B2 | 10/2015 | Chihlas et al. | |
| 9,169,646 B2 | 10/2015 | Rodrigues et al. | |
| 9,170,034 B2 | 10/2015 | Bosler et al. | |
| 9,178,465 B2 | 11/2015 | Shiao et al. | |
| 9,202,955 B2 | 12/2015 | Livsey et al. | |
| 9,212,832 B2 | 12/2015 | Jenkins | |
| 9,217,584 B2 | 12/2015 | Kalkanoglu et al. | |
| 9,270,221 B2 | 2/2016 | Zhao | |
| 9,273,885 B2 | 3/2016 | Rodrigues et al. | |
| 9,276,141 B2 | 3/2016 | Kalkanoglu et al. | |
| 9,331,224 B2 | 5/2016 | Koch et al. | |
| 9,356,174 B2 | 5/2016 | Duarte et al. | |
| 9,359,014 B1 | 6/2016 | Yang et al. | |
| 9,528,270 B2 | 12/2016 | Jenkins et al. | |
| 9,605,432 B1 | 3/2017 | Robbins | |
| 9,711,672 B2 | 7/2017 | Wang | |
| 9,711,991 B2 | 7/2017 | Hall et al. | |
| 9,755,573 B2 | 9/2017 | Livsey et al. | |
| 9,786,802 B2 | 10/2017 | Shiao et al. | |
| 9,831,818 B2 | 11/2017 | West | |
| 9,912,284 B2 | 3/2018 | Svec | |
| 9,923,515 B2 | 3/2018 | Rodrigues et al. | |
| 9,938,729 B2 | 4/2018 | Coon | |
| 9,991,412 B2 | 6/2018 | Gonzalez et al. | |
| 9,998,067 B2 | 6/2018 | Kalkanoglu et al. | |
| 10,027,273 B2 | 7/2018 | West et al. | |
| 10,115,850 B2 | 10/2018 | Rodrigues et al. | |
| 10,128,660 B1 | 11/2018 | Apte et al. | |
| 10,187,005 B2 | 1/2019 | Rodrigues et al. | |
| 10,256,765 B2 | 4/2019 | Rodrigues et al. | |
| 10,454,408 B2 | 10/2019 | Livsey et al. | |
| 10,530,292 B1 | 1/2020 | Cropper et al. | |
| 10,560,048 B2 | 2/2020 | Fisher et al. | |
| 10,563,406 B2 | 2/2020 | Kalkanoglu et al. | |
| D879,031 S | 3/2020 | Lance et al. | |
| 10,784,813 B2 | 9/2020 | Kalkanoglu et al. | |
| D904,289 S | 12/2020 | Lance et al. | |
| 11,012,026 B2 | 5/2021 | Kalkanoglu et al. | |
| 11,177,639 B1 | 11/2021 | Nguyen et al. | |
| 11,217,715 B2 | 1/2022 | Sharenko et al. | |
| 11,251,744 B1 | 2/2022 | Bunea et al. | |
| 11,258,399 B2 | 2/2022 | Kalkanoglu et al. | |
| 11,283,394 B2 | 3/2022 | Perkins et al. | |
| 2002/0053360 A1 | 5/2002 | Kinoshita et al. | |
| 2002/0129849 A1 | 9/2002 | Heckeroth | |
| 2003/0101662 A1 | 6/2003 | Ullman | |
| 2003/0132265 A1 | 7/2003 | Villela et al. | |
| 2003/0217768 A1 | 11/2003 | Guha | |
| 2005/0072456 A1 * | 4/2005 | Stevenson | H02S 20/23 136/251 |
| 2005/0115603 A1 | 6/2005 | Yoshida et al. | |
| 2005/0144870 A1 | 7/2005 | Dinwoodie | |
| 2006/0042683 A1 | 3/2006 | Gangemi | |
| 2007/0181174 A1 | 8/2007 | Ressler | |
| 2007/0193618 A1 * | 8/2007 | Bressler | G09F 27/007 136/244 |
| 2008/0006323 A1 | 1/2008 | Kalkanoglu et al. | |
| 2008/0035140 A1 | 2/2008 | Placer et al. | |
| 2008/0315061 A1 | 2/2008 | Placer et al. | |
| 2008/0245405 A1 * | 10/2008 | Garvison | H02S 30/20 52/173.3 |
| 2008/0271774 A1 | 11/2008 | Kalkanoglu et al. | |
| 2009/0000222 A1 | 1/2009 | Kalkanoglu et al. | |
| 2009/0019795 A1 | 1/2009 | Szacsvay et al. | |
| 2009/0044850 A1 | 2/2009 | Kimberley | |
| 2009/0114261 A1 | 5/2009 | Stancel et al. | |

(56) References Cited

U.S. PATENT DOCUMENTS

| | | | |
|---|---|---|---|
| 2009/0133340 A1 | 5/2009 | Shiao et al. | |
| 2009/0159118 A1 | 6/2009 | Kalkanoglu et al. | |
| 2009/0178350 A1 | 7/2009 | Kalkanoglu et al. | |
| 2009/0229652 A1 | 9/2009 | Mapel et al. | |
| 2010/0101634 A1 | 4/2010 | Frank et al. | |
| 2010/0139184 A1 | 6/2010 | Williams et al. | |
| 2010/0146878 A1* | 6/2010 | Koch | H01L 31/048 52/173.3 |
| 2010/0159221 A1 | 6/2010 | Kourtakis et al. | |
| 2010/0275534 A1 | 11/2010 | Ruskin et al. | |
| 2010/0313499 A1 | 12/2010 | Gangemi | |
| 2010/0325976 A1 | 12/2010 | Degenfelder et al. | |
| 2010/0326488 A1 | 12/2010 | Aue et al. | |
| 2010/0326501 A1 | 12/2010 | Zhao et al. | |
| 2011/0030761 A1 | 2/2011 | Kalkanoglu et al. | |
| 2011/0036386 A1 | 2/2011 | Browder | |
| 2011/0048507 A1 | 3/2011 | Livsey et al. | |
| 2011/0058337 A1 | 3/2011 | Han et al. | |
| 2011/0061326 A1 | 3/2011 | Jenkins | |
| 2011/0100436 A1* | 5/2011 | Cleereman | H01L 31/05 136/251 |
| 2011/0104488 A1 | 5/2011 | Muessig et al. | |
| 2011/0132427 A1 | 6/2011 | Kalkanoglu et al. | |
| 2011/0239555 A1 | 10/2011 | Cook et al. | |
| 2011/0302859 A1 | 12/2011 | Crasnianski | |
| 2012/0060902 A1 | 3/2012 | Drake | |
| 2012/0132246 A1* | 5/2012 | Hunt | H01L 31/0201 257/E31.113 |
| 2012/0137600 A1 | 6/2012 | Jenkins | |
| 2012/0176077 A1 | 7/2012 | Oh et al. | |
| 2012/0212065 A1 | 8/2012 | Cheng et al. | |
| 2012/0233940 A1 | 9/2012 | Perkins et al. | |
| 2012/0240490 A1 | 9/2012 | Gangemi | |
| 2012/0260977 A1 | 10/2012 | Stancel | |
| 2012/0266942 A1 | 10/2012 | Komatsu et al. | |
| 2012/0279150 A1 | 11/2012 | Pislkak et al. | |
| 2013/0014455 A1 | 1/2013 | Grieco | |
| 2013/0193769 A1 | 8/2013 | Mehta et al. | |
| 2013/0247988 A1 | 9/2013 | Reese et al. | |
| 2013/0306137 A1 | 11/2013 | Ko | |
| 2014/0150843 A1 | 6/2014 | Pearce et al. | |
| 2014/0173997 A1 | 6/2014 | Jenkins | |
| 2014/0179220 A1 | 6/2014 | Railkar et al. | |
| 2014/0311556 A1 | 10/2014 | Feng et al. | |
| 2014/0352760 A1 | 12/2014 | Haynes et al. | |
| 2014/0366464 A1 | 12/2014 | Rodrigues et al. | |
| 2015/0083191 A1* | 3/2015 | Gmundner | H02S 30/20 136/245 |
| 2015/0340516 A1 | 11/2015 | Kim et al. | |
| 2015/0349173 A1 | 12/2015 | Morad et al. | |
| 2016/0105144 A1 | 4/2016 | Haynes et al. | |
| 2016/0276508 A1* | 9/2016 | Huang | H02S 30/20 |
| 2016/0359451 A1 | 12/2016 | Mao et al. | |
| 2017/0159292 A1 | 6/2017 | Chihlas et al. | |
| 2017/0179726 A1 | 6/2017 | Garrity et al. | |
| 2017/0331415 A1 | 11/2017 | Koppi et al. | |
| 2018/0094438 A1 | 4/2018 | Wu et al. | |
| 2018/0097472 A1 | 4/2018 | Anderson et al. | |
| 2018/0351502 A1 | 12/2018 | Almy et al. | |
| 2019/0030867 A1 | 1/2019 | Sun et al. | |
| 2019/0081436 A1 | 3/2019 | Onodi et al. | |
| 2019/0273463 A1 | 9/2019 | Seery et al. | |
| 2019/0305717 A1 | 10/2019 | Allen et al. | |
| 2020/0020819 A1 | 1/2020 | Farhangi | |
| 2020/0109320 A1 | 4/2020 | Jiang | |
| 2020/0144958 A1 | 5/2020 | Rodrigues et al. | |
| 2020/0220819 A1 | 7/2020 | Vu et al. | |
| 2020/0224419 A1 | 7/2020 | Boss et al. | |
| 2020/0343397 A1 | 10/2020 | Hem-Jensen | |
| 2021/0115223 A1 | 4/2021 | Bonekamp et al. | |
| 2021/0159353 A1 | 5/2021 | Li et al. | |

FOREIGN PATENT DOCUMENTS

| | | | |
|---|---|---|---|
| CN | 202797031 | * | 3/2013 |
| CN | 202797032 U | | 3/2013 |
| DE | 1958248 A1 | | 11/1971 |
| DE | 1837162 | * | 9/2007 |
| EP | 1837162 A1 | | 9/2007 |
| EP | 1774372 A1 | | 7/2011 |
| EP | 2784241 A1 | | 10/2014 |
| JP | 2001-098703 A | | 4/2001 |
| JP | 2017-027735 A | | 2/2017 |
| JP | 2017027735 | * | 2/2017 |
| KR | 10-1530486 B1 | | 6/2015 |
| WO | 2011/049944 A1 | | 4/2011 |
| WO | 2014/189391 A1 | | 11/2014 |
| WO | 2015/133632 A1 | | 9/2015 |
| WO | 2015/183827 A2 | | 12/2015 |
| WO | 2019/201416 A1 | | 10/2019 |

OTHER PUBLICATIONS

EP1837162 English translation (Year: 2007).*
Sunflare, Procducts: "Sunflare Develops Prototype For New Residential Solar Shingles"; 2019 <<sunflaresolar.com/news/sunflare-develops-prototype-for-new-residential-solar-shingles>> retrieved Feb. 2, 2021.
RGS Energy, 3.5kW Powerhouse 3.0 system installed in an afternoon; Jun. 7, 2019 <<facebook.com/RGSEnergy/>> retrieved Feb. 2, 2021.
Tesla, Solar Roof <<tesla.com/solarroof>> retrieved Feb. 2, 2021.
"Types of Roofing Underlayment", Owens Corning Roofing; <<https://www.owenscorning.com/en-us/roofing/tools/how-roofing-underlayment-helps-protect-your-home>> retrieved Nov. 1, 2021.

* cited by examiner

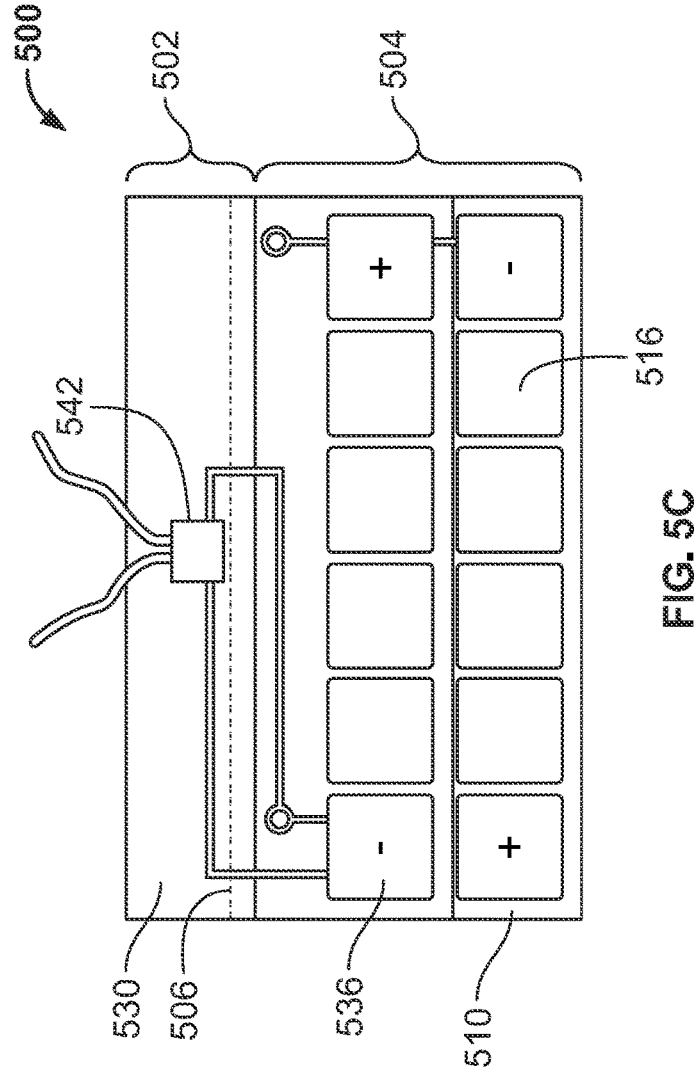
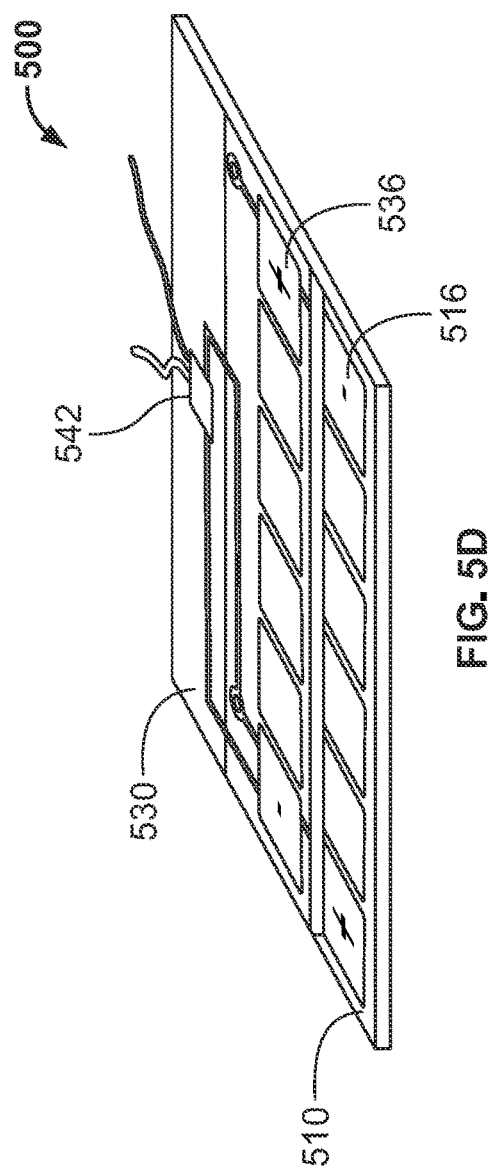

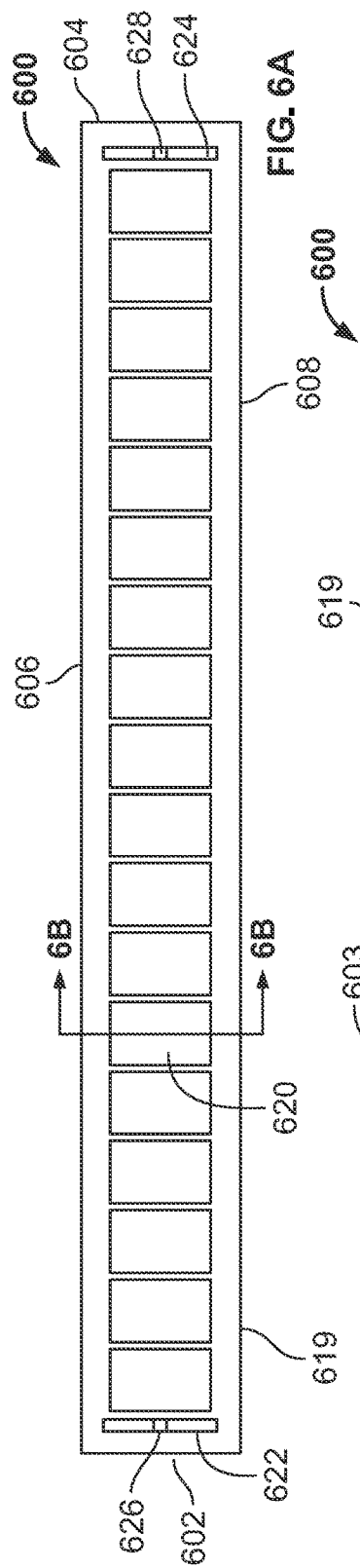
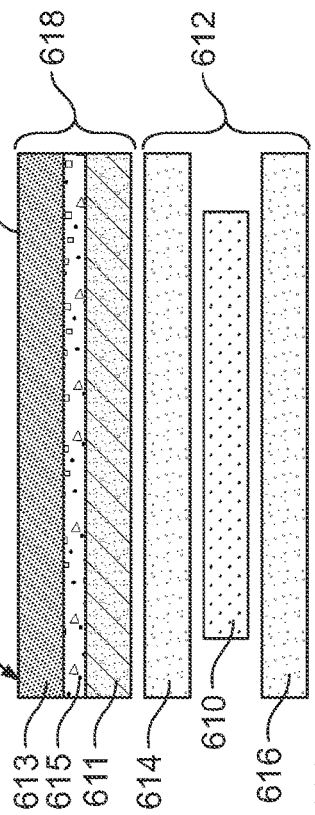

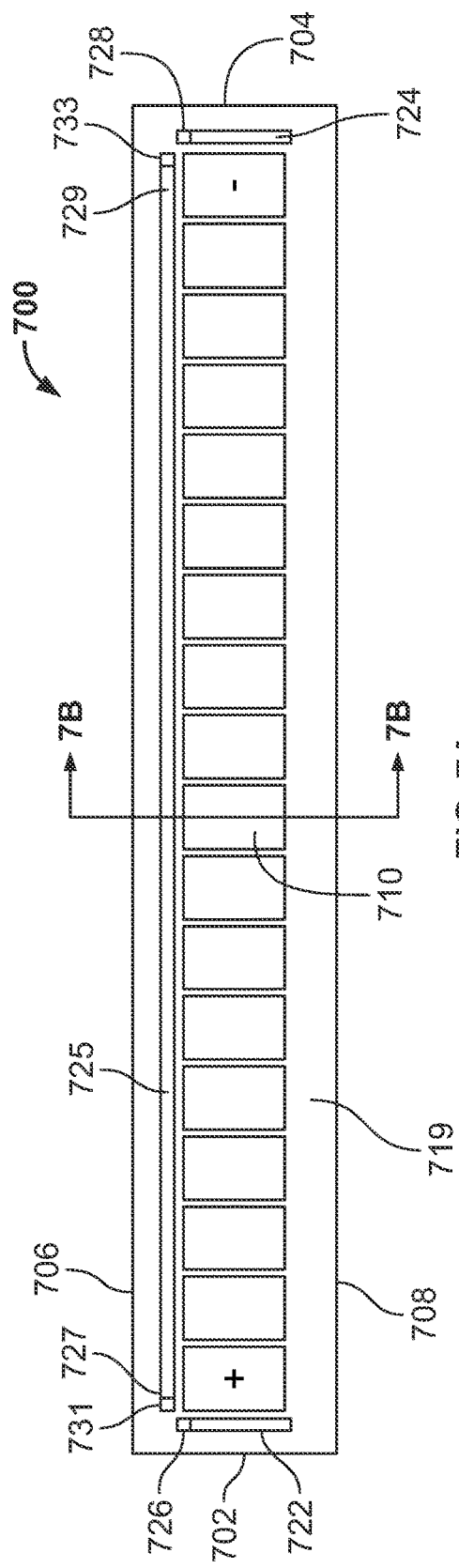
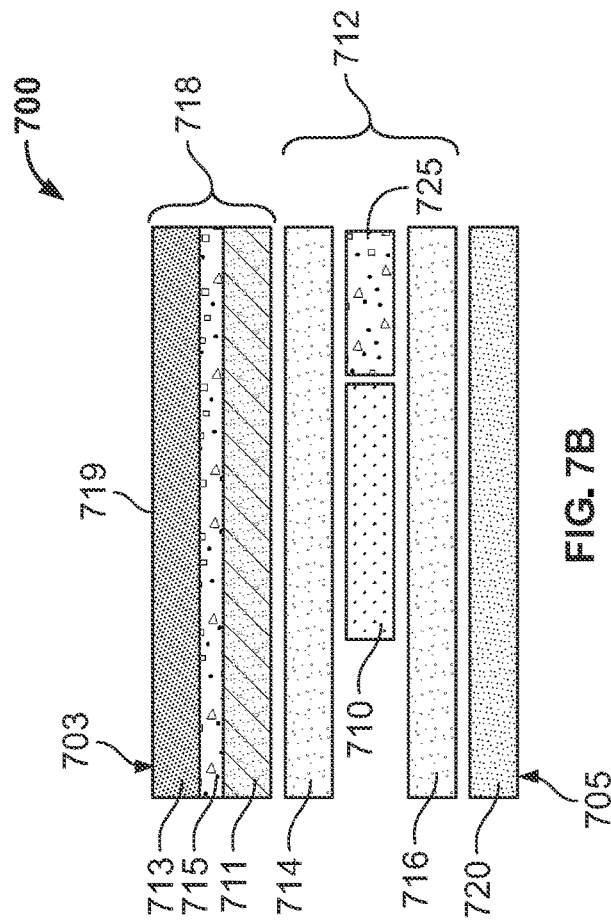
FIG. 7A
FIG. 7B

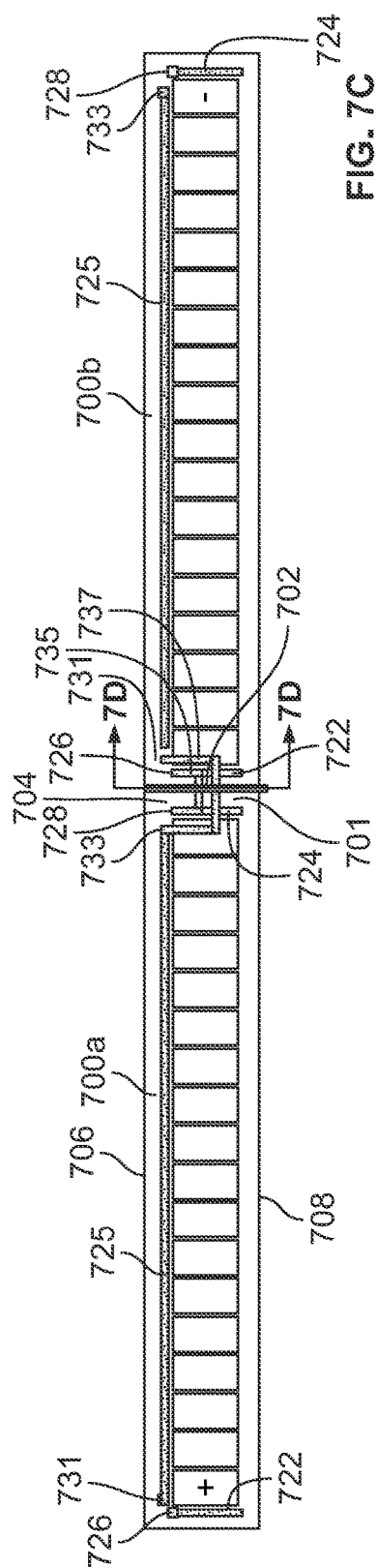
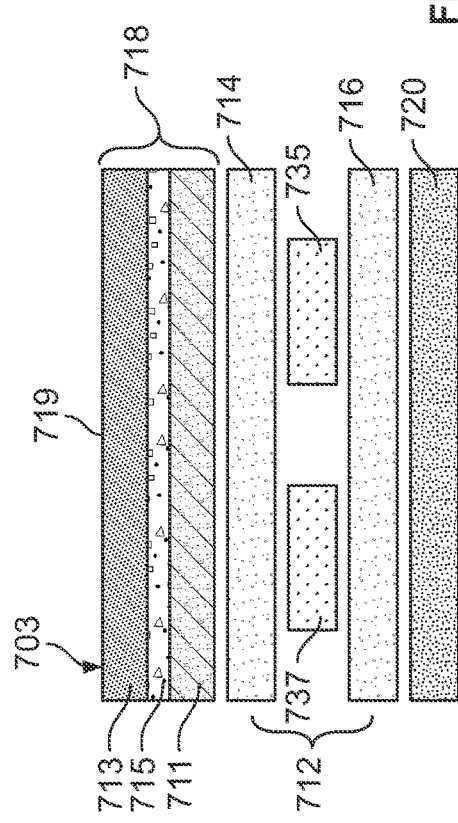
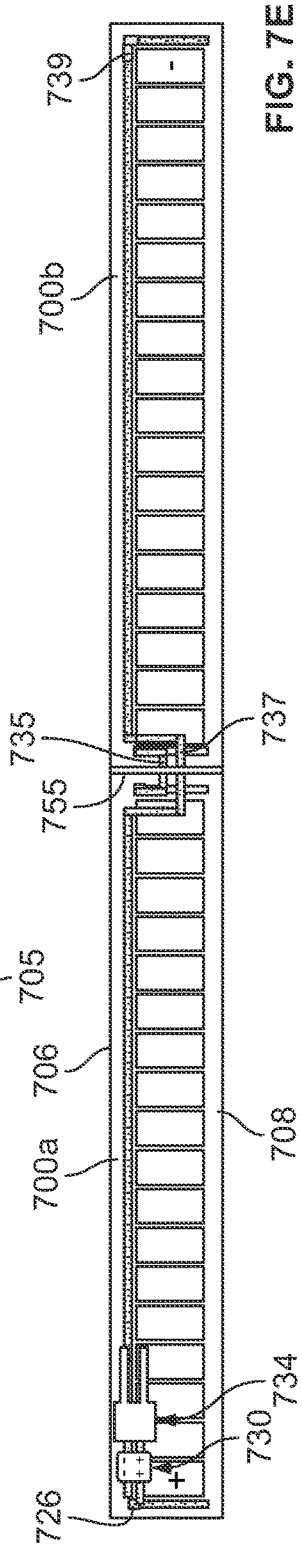

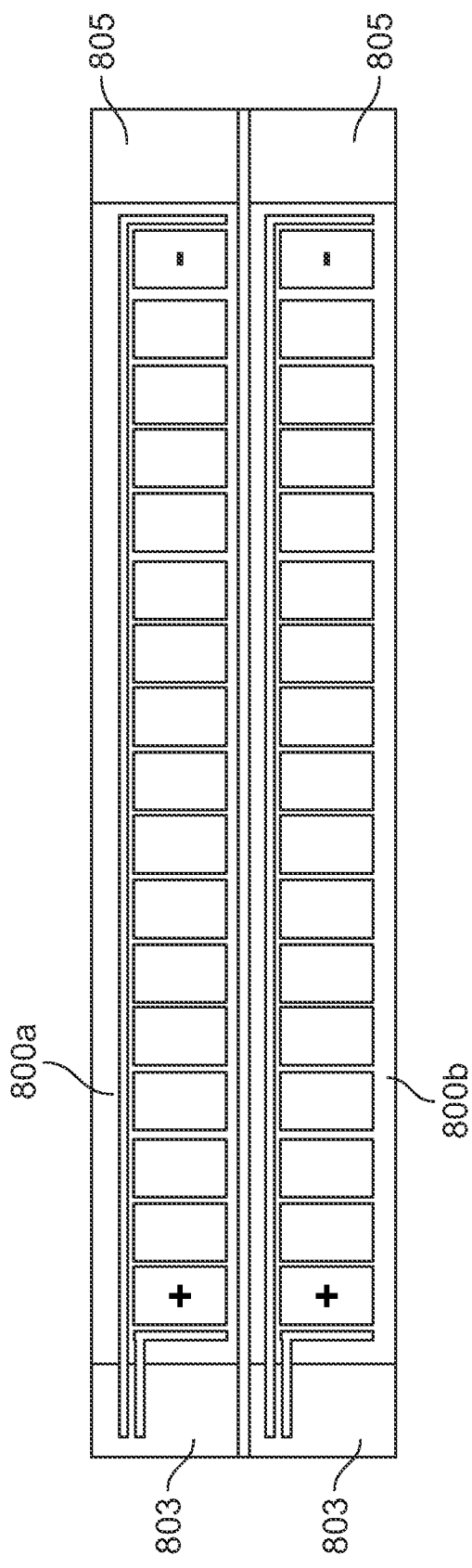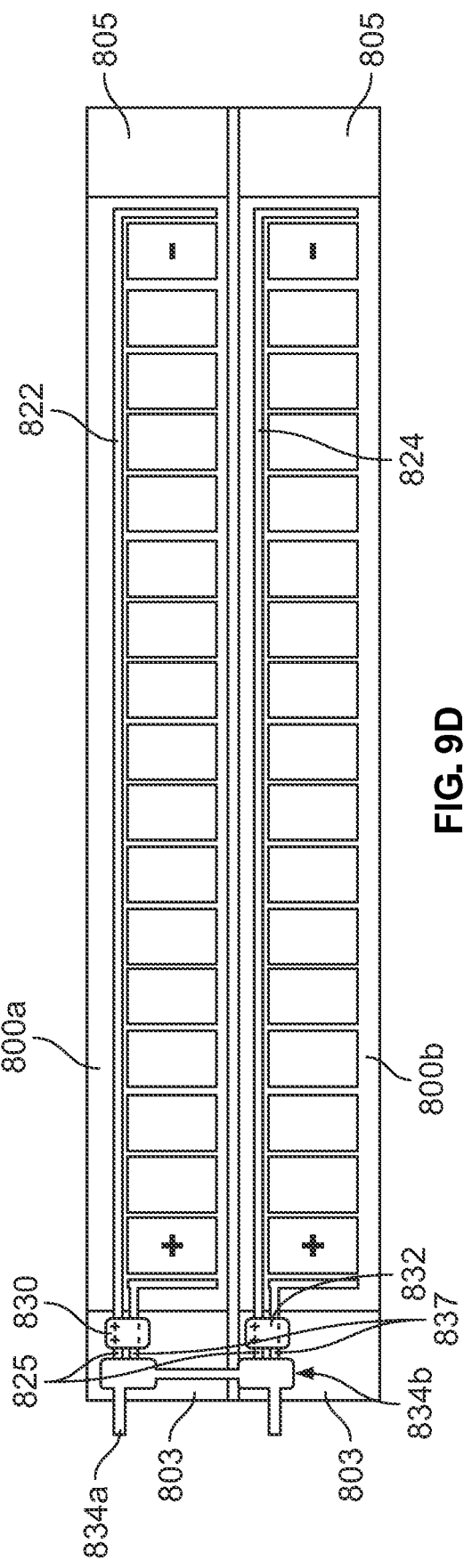

THREE-DIMENSIONAL LAMINATE PHOTOVOLTAIC MODULE

CROSS-REFERENCE TO RELATED APPLICATIONS

This application is a Section 111(a) application relating to and claiming the benefit of commonly-owned, U.S. Provisional Patent Application Ser. No. 63/007,570, filed Apr. 9, 2020, entitled "THREE-DIMENSIONAL LAMINATE SOLAR ROOF TILE," U.S. Provisional Patent Application Ser. No. 63/035,470, filed Jun. 5, 2020, entitled "THREE-DIMENSIONAL LAMINATE SOLAR ROOF TILE," and U.S. Provisional Patent Application Ser. No. 63/117,172, filed Nov. 23, 2020, entitled "THREE-DIMENSIONAL LAMINATE SOLAR ROOF TILE," the contents of which are incorporated herein by reference in their entirety.

FIELD OF THE INVENTION

The present invention relates to roof-integrated photovoltaic modules. More particularly, the present invention relates to roof-integrated photovoltaic modules having three-dimensional elements, and roofing systems including such modules

BACKGROUND

Solar modules can be placed on building roofs (e.g., residential roofs) to generate electricity. One obstacle to mass-market adoption of solar roofing is poor aesthetics. Standard rack-mounted photovoltaic ("PV") systems have a very different appearance than traditional roofing materials (e.g., asphalt shingles, wooden shingles, slate shingles, etc.), which can draw unwanted attention. Even low-profile PV systems still receive poor aesthetic feedback from consumers.

Specifically, typical photovoltaic module materials and circuit formations are planar and do not visually match the look of asphalt roofing shingles, which themselves have multiple layers. Also, typical roof shingles overlap from one row to the next down the roof, ensuring that nails and any gaps are covered and preventing water from reaching the roof deck. photovoltaic modules that are larger than a single row do not have this overlapping and need to be separately flashed in with the other roofing material.

SUMMARY

In an embodiment, a system includes a first photovoltaic module and a second photovoltaic module, each of the first photovoltaic module and second photovoltaic module includes a first end, a second end opposite the first end, a first side extending from the first end to the second end, a second side opposite the first side and extending from the first end to the second end, a first surface and a second surface opposite the first surface; at least one solar cell; an encapsulant encapsulating the at least one solar cell, wherein the encapsulant includes a first surface and a second surface opposite the first surface of the encapsulant; and a frontsheet juxtaposed with the first surface of the encapsulant, wherein the second surface of the first photovoltaic module proximate to the second side of the first photovoltaic module is attached to the first surface of the second photovoltaic module proximate to the first side of the second photovoltaic module.

In an embodiment, the first photovoltaic module is ultrasonically welded to the second photovoltaic module. In an embodiment, the first photovoltaic module is heat welded to the second photovoltaic module. In an embodiment, the first photovoltaic module is thermally bonded to the second photovoltaic module. In an embodiment, the first photovoltaic module is attached to the second photovoltaic module by an adhesive. In an embodiment, the first photovoltaic module is attached to the second photovoltaic module by an adhesive tape.

In an embodiment, each of the first photovoltaic module and second photovoltaic module includes a backsheet juxtaposed with the second surface of the encapsulant. In an embodiment, the backsheet includes thermoplastic polyolefin (TPO). In an embodiment, each of the first photovoltaic module and the second photovoltaic module includes a first electrical bussing located proximate to the first end thereof, a second electrical bussing located proximate to the second end thereof, a first solder pad extending outwardly from an upper surface of the frontsheet and electrically connected to the first electrical bussing, and a second solder pad extending outwardly from the upper surface of the frontsheet and electrically connected to the second electrical bussing. In an embodiment, the first photovoltaic module includes a first power optimizer, and the second photovoltaic module includes a second power optimizer. In an embodiment, the system includes a junction box electrically connected to the first power optimizer and the second power optimizer.

In an embodiment, the system includes a third electrical bussing electrically connected to the first solder pad of the first photovoltaic module and a first terminal of the first power optimizer, a fourth electrical bussing electrically connected to the second solder pad of the first photovoltaic module and a second terminal of the first power optimizer, a fifth electrical bussing electrically connected to the first solder pad of the second photovoltaic module and to a first terminal of the second power optimizer, a sixth electrical bussing electrically connected to the second solder pad of the second photovoltaic module and a second terminal of the second power optimizer, a seventh electrical bussing electrically connected to the first terminal of the first power optimizer and to the junction box, an eighth electrical bussing electrically connected to the first terminal of the second power optimizer and the junction box, and a ninth electrical bussing electrically connected to the second terminal of the first power optimizer and the second terminal of the second power optimizer.

In an embodiment, each of the first photovoltaic module and the second photovoltaic module includes at least one side flap located at the first end. In an embodiment, the system includes a first power optimizer and a first junction box electrically connected to the first power optimizer, wherein the first power optimizer and the first junction box are juxtaposed with the at least one side flap of the first photovoltaic module.

In an embodiment, a system includes a first photovoltaic module and a second photovoltaic module, each of the first photovoltaic module and the second photovoltaic module includes a first end, a second end opposite the first end, a first side extending from the first end to the second end, a second side opposite the first side and extending from the first end to the second end, a first surface and a second surface opposite the first surface; at least one solar cell; an encapsulant encapsulating the at least one solar cell, wherein the encapsulant includes a first surface and a second surface opposite the first surface of the encapsulant; and a frontsheet juxtaposed with the first surface of the encapsulant, wherein the second surface of the first photovoltaic module proximate to the second end of the first photovoltaic module is attached to the first surface of the second photovoltaic module proximate to the first end of the second photovoltaic module.

In an embodiment, the first photovoltaic module is ultrasonically welded to the second photovoltaic module. In an embodiment, the first photovoltaic module is heat welded to the second photovoltaic module. In an embodiment, the first photovoltaic module is thermally bonded to the second photovoltaic module. In an embodiment, the first photovoltaic module is attached to the second photovoltaic module by an adhesive. In an embodiment, the first photovoltaic module is attached to the second photovoltaic module by an adhesive tape.

In an embodiment, the system includes at least one side flap located at the first end of the first photovoltaic module and at least one side flap located at the second end of the second photovoltaic module. In an embodiment, the system includes a power optimizer and a junction box electrically connected to the power optimizer, wherein the power optimizer and the junction box are juxtaposed with one of the at least one side flap of the first photovoltaic module.

BRIEF DESCRIPTION OF THE DRAWINGS

FIG. 5C shows a top view of an exemplary photovoltaic module made by combining the first module segment shown in FIG. 5A with the second module segment shown in FIG. 5B.

FIG. 5D shows a perspective view of the exemplary photovoltaic module of FIG. 5C.

FIG. 6A shows a top plan view of an embodiment of a photovoltaic module.

FIG. 6B is a cross-sectional view, taken along line 6B-6B and looking in the direction of the arrows, of the photovoltaic module of FIG. 6A.

FIGS. 6C and 6D are top plan views of an embodiment of first and second photovoltaic modules shown in FIG. 6A attached to one another.

FIG. 7A shows a top plan view of an embodiment of a photovoltaic module.

FIG. 7B is a cross-sectional view, taken along line 7B-7B and looking in the direction of the arrows, of the photovoltaic module of FIG. 7A.

FIG. 7C is a top plan view of an embodiment of first and second photovoltaic modules shown in FIG. 7A attached to one another.

FIG. 7D is a cross-sectional view, taken along line 7D-7D and looking in the direction of the arrows, of the photovoltaic modules of FIG. 7C.

FIG. 7E is a top plan view of an embodiment the first and second photovoltaic modules shown in FIG. 7C.

FIGS. 9C and 9D are top plan views of an embodiment of first and second photovoltaic modules shown in FIG. 9A attached to one another.

DETAILED DESCRIPTION

Figure 1:
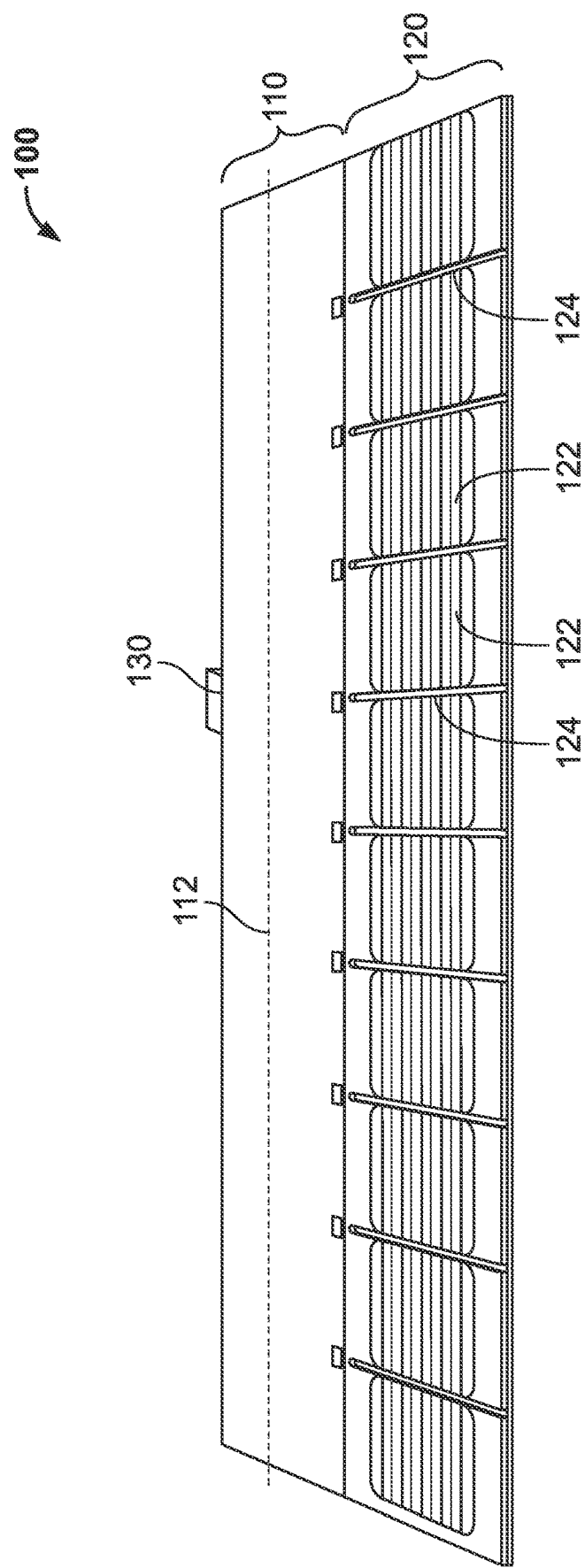
FIG. 1 shows a perspective view of an exemplary photovoltaic module.

The present invention will be further explained with reference to the attached drawings, wherein like structures are referred to by like numerals throughout the several views. The drawings shown are not necessarily to scale, with emphasis instead generally being placed upon illustrating the principles of the present invention. Further, some features may be exaggerated to show details of particular components.

The figures constitute a part of this specification and include illustrative embodiments of the present invention and illustrate various objects and features thereof. Further, the figures are not necessarily to scale, some features may be exaggerated to show details of particular components. In addition, any measurements, specifications and the like shown in the figures are intended to be illustrative, and not restrictive. Therefore, specific structural and functional details disclosed herein are not to be interpreted as limiting, but merely as a representative basis for teaching one skilled in the art to variously employ the present invention.

Among those benefits and improvements that have been disclosed, other objects and advantages of this invention will become apparent from the following description taken in conjunction with the accompanying figures. Detailed embodiments of the present invention are disclosed herein; however, it is to be understood that the disclosed embodiments are merely illustrative of the invention that may be embodied in various forms. In addition, each of the examples given in connection with the various embodiments of the invention which are intended to be illustrative, and not restrictive.

Throughout the specification and claims, the following terms take the meanings explicitly associated herein, unless the context clearly dictates otherwise. The phrases "in one embodiment" and "in some embodiments" as used herein do not necessarily refer to the same embodiment(s), though they may. Furthermore, the phrases "in another embodiment" and "in some other embodiments" as used herein do not necessarily refer to a different embodiment, although they may. Thus, as described below, various embodiments of the invention may be readily combined, without departing from the scope or spirit of the invention.

The term "based on" is not exclusive and allows for being based on additional factors not described, unless the context clearly dictates otherwise. In addition, throughout the specification, the meaning of "a," "an," and "the" include plural references. The meaning of "in" includes "in" and "on."

The exemplary embodiments relate to layered photovoltaic ("PV") modules that include In some embodiments, a photovoltaic module includes a single pair of external connectors but and multiple layers of laminated circuits. In some embodiments, multiple layers are connected by folding the laminate over on itself. In some embodiments, layers are connected through a permanent bond between two separately made laminates. In some embodiments, a photovoltaic module includes a single electrical circuit with elements in different planes using a structured back surface within a single laminate. In some embodiments, a photovoltaic module includes a single electrical circuit within a single plane, with the front surface of the laminate structured to have different planes. In some embodiments including multiple layers, the upper laminates or planes have gaps and cutouts such that light can be captured by lower laminates or planes. In some embodiments including a single plane, the materials above the cells are optically clear to allow light to the solar cells.

FIG. 1 shows an embodiment of a photovoltaic module 100. In an embodiment, the photovoltaic module 100 includes a headlap region 110 and a PV region 120. In some embodiments, the headlap region 110 comprises thermoplastic olefin ("TPO"), polyvinyl chloride ("PVC"), or asphalt. In some embodiments, the headlap region 110 includes embedded granules. In some embodiments, the headlap region 110 defines a nailing line 112 extending across the headlap region 110. In some embodiments, the nailing line 112 extends across the headlap region 110 approximately midway between the end of the headlap region 110 that borders the PV region and the opposite end of the headlap region 110. In some embodiments, the nailing line 112 defines an area of the headlap region 110 through which mechanical fasteners (e.g., nails, screws, etc.) can be driven to secure the photovoltaic module to a roof deck in the standard manner.

In some embodiments, the PV region 120 includes a plurality of PV portions 122. In some embodiments, each of the PV portions 122 includes a layered structure that is typical of a laminate photovoltaic module, as discussed below with reference to FIGS. 2A and 2B. In some embodiments, the PV region 120 includes grooves 124 separating adjacent ones of the PV portions. In some embodiments, each of the PV portions 122 is separately formed from others of the PV portions 122, and the grooves 124 are formed by spaces between adjacent ones of the PV portions 122. In some embodiments, the PV portions 122 forming the PV region 120 are integrally formed with one another (e.g., form a single layered structure) and the grooves 124 are formed in a superstrate layer thereof. In some embodiments, the grooves 124 between adjacent ones of the PV portions 122 provide the appearance of discrete portions similar to those of conventional shingles. In some embodiments, the PV region 120 is formed atop material of the headlap region 110 (e.g., the substrate of the PV region 120 is deposited on the material of the headlap region 110). In some embodiments, the PV region 120 and the headlap region 110 join one another end-to-end.

In some embodiments, the photovoltaic module 100 includes a junction box 130. In some embodiments, the junction box 130 is positioned at an end of the headlap region 110 that is opposite the PV region 120. In some embodiments, the junction box 130 is positioned at a center of an end of the headlap region 110 that is opposite the PV region 120. In some embodiments, the junction box 130 is electrically connected to the PV region 120 by electrical connectors (e.g., wires) that traverse (e.g., pass under or through) the headlap region 110.

Figure 2A:
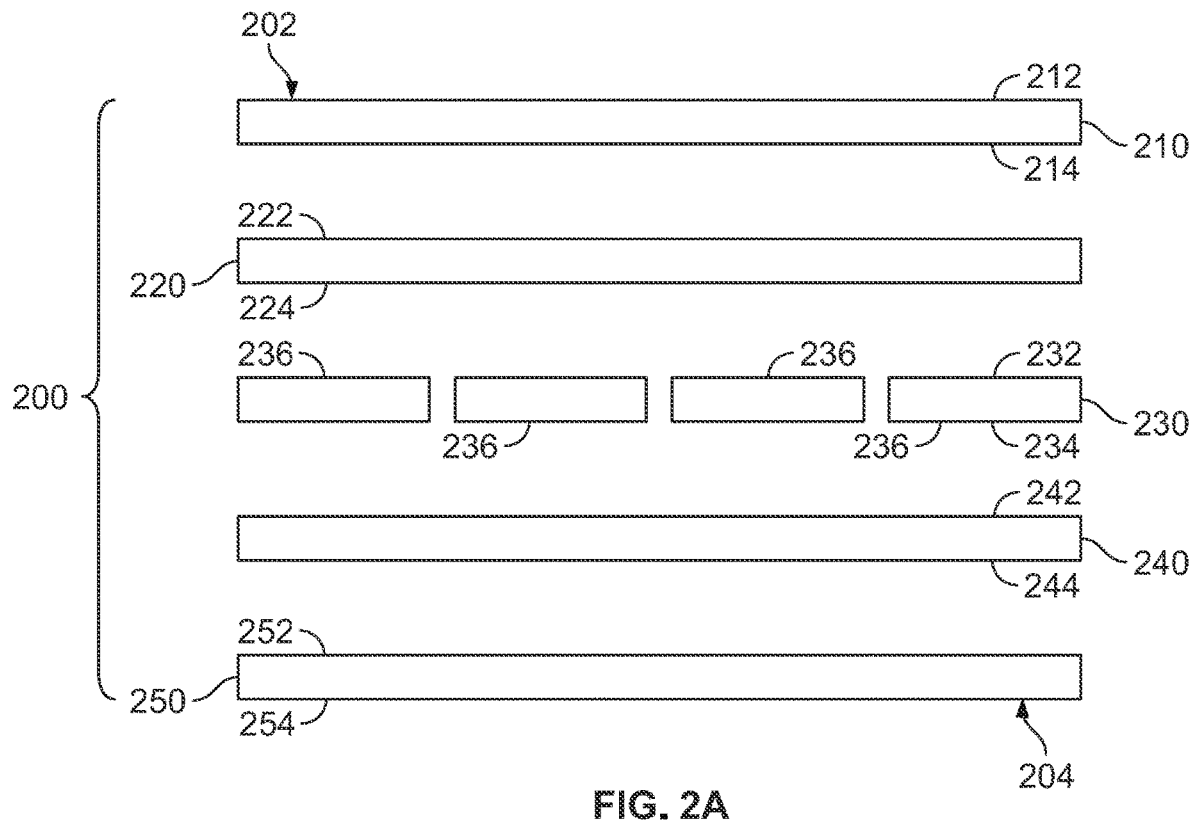
FIG. 2A shows a schematic view of elements of a layered structure of an exemplary photovoltaic module before lamination.
Figure 2B:
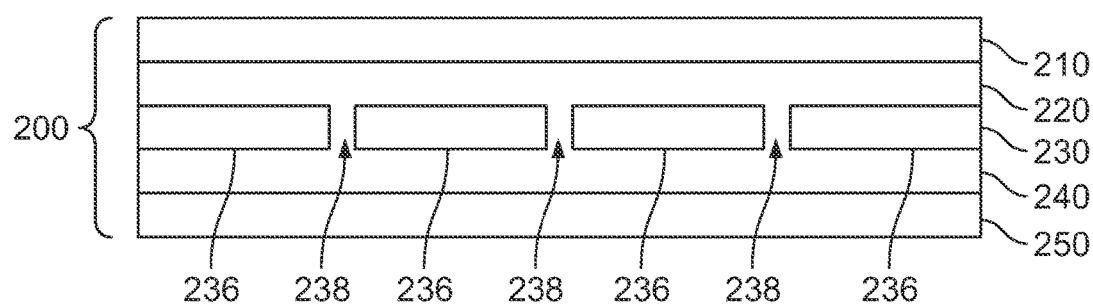
FIG. 2B shows a schematic view of a layered structure of an exemplary photovoltaic module formed by lamination of the elements shown in FIG. 2A.

In some embodiments, such as the photovoltaic module 100 discussed above with reference to FIG. 1, an exemplary photovoltaic module includes a layered structure. FIGS. 2A and 2B show an exemplary embodiment of a layered structure 200 that, in some embodiments, forms part of an exemplary photovoltaic module FIG. 2A shows an exploded view of the layers of the layered structure 200 prior to lamination to form the layered structure 200. FIG. 2B shows the layered structure following lamination. It will be apparent to those of skill in the art that FIGS. 2A and 2B present schematic views of the layered structure 200 and are not intended to provide a to-scale representation.

Referring now to FIG. 2A, in some embodiments, the layered structure 200 includes a superstrate layer 210 that forms an upper surface of the layered structure 200 and of the photovoltaic module 100 (i.e., the surface that, when the photovoltaic module 100 is installed on a roof, faces away from the roof and toward the sun). In some embodiments, the superstrate layer 210 has an upper surface 212 (i.e., the side of the superstrate layer 210 that faces toward the sun when installed as described above) and a lower surface 214 opposite the upper surface 212. In some embodiments, the upper surface 212 of the superstrate layer 210 forms an upper surface 202 of the layered structure 200. In some embodiments, the superstrate layer 210 is optically transparent (e.g., it has a solar weighted transmittance of 80% or greater). In some embodiments, the superstrate provides electrical insulation and moisture resistance. In some embodiments, the superstrate layer 210 comprises a glass material, such as low-iron solar glass. In some embodiments, the superstrate layer 210 comprises a polymeric material such as ethylene tetrafluoroethylene ("ETFE"), polyethylene terephthalate ("PET"), or an acrylic such as polymethyl methacrylate ("PMMA"). In some embodiments, the superstrate layer 210 has a thickness of from 50 microns to 250 microns. In some embodiments, the superstrate layer 210 has a thickness of from 50 microns to 200 microns. In some embodiments, the superstrate layer 210 has a thickness of from 50 microns to 150 microns. In some embodiments, the superstrate layer 210 has a thickness of from 50 microns to 100 microns. In some embodiments, the superstrate layer 210 has a thickness of from 100 microns to 250 microns. In some embodiments, the superstrate layer 210 has a thickness of from 100 microns to 200 microns. In some embodiments, the superstrate layer 210 has a thickness of from 100 microns to 150 microns. In some embodiments, the superstrate layer 210 has a thickness of from 150 microns to 250 microns. In some embodiments, the superstrate layer 210 has a thickness of from 150 microns to 200 microns. In some embodiments, the superstrate layer 210 has a thickness of from 200 microns to 250 microns.

In some embodiments, the superstrate layer 210 has a thickness of from 200 microns to 500 microns. In some embodiments, the superstrate layer 210 has a thickness of from 200 microns to 450 microns. In some embodiments, the superstrate layer 210 has a thickness of from 200 microns to 400 microns. In some embodiments, the superstrate layer 210 has a thickness of from 200 microns to 350 microns. In some embodiments, the superstrate layer 210 has a thickness of from 200 microns to 300 microns. In some embodiments, the superstrate layer 210 has a thickness of from 250 microns to 500 microns. In some embodiments, the superstrate layer 210 has a thickness of from 250 microns to 450 microns. In some embodiments, the superstrate layer 210 has a thickness of from 250 microns to 400 microns. In some embodiments, the superstrate layer 210 has a thickness of from 250 microns to 350 microns. In some embodiments, the superstrate layer 210 has a thickness of from 250 microns to 300 microns. In some embodiments, the superstrate layer 210 has a thickness of from 300 microns to 500 microns. In some embodiments, the superstrate layer 210 has a thickness of from 300 microns to 500 microns. In some embodiments, the superstrate layer 210 has a thickness of from 300 microns to 450 microns. In some embodiments, the superstrate layer 210 has a thickness of from 300 microns to 400 microns. In some embodiments, the superstrate layer 210 has a thickness of from 300 microns to 350 microns. In some embodiments, the superstrate layer 210 has a thickness of from 350 microns to 500 microns. In some embodiments, the superstrate layer 210 has a thickness of from 350 microns to 450 microns. In some embodiments, the superstrate layer 210 has a thickness of from 350 microns to 400 microns. In some embodiments, the superstrate layer 210 has a thickness of from 400 microns to 500 microns. In some embodiments, the superstrate layer 210 has a thickness of from 400 microns to 450 microns. In some embodiments, the superstrate layer 210 has a thickness of from 450 microns to 500 microns. In some embodiments, the superstrate layer 210 has a thickness of from 325 microns to 375 microns. In some embodiments, the superstrate layer 210 has a thickness of about 300 microns. In some embodiments, the superstrate layer 210 has a thickness of 300 microns.

In some embodiments, the superstrate layer 210 has a thickness of from 1.6 millimeters to 4.0 millimeters. In some embodiments, the superstrate layer 210 has a thickness of from 1.6 millimeters to 3.2 millimeters. In some embodiments, the superstrate layer 210 has a thickness of from 1.6 millimeters to 2.4 millimeters. In some embodiments, the superstrate layer 210 has a thickness of from 2.4 millimeters to 4.0 millimeters. In some embodiments, the superstrate layer 210 has a thickness of from 2.4 millimeters to 3.2 millimeters. In some embodiments, the superstrate layer 210 has a thickness of from 3.2 millimeters to 4.0 millimeters. In some embodiments, the superstrate layer 210 has a thickness of from 2.8 millimeters to 3.6 millimeters. In some embodiments, the superstrate layer 210 has a thickness of from 3.0 millimeters to 3.4 millimeters. In some embodiments, the superstrate layer 210 has a thickness of from 3.1 millimeters to 3.3 millimeters. In some embodiments, the superstrate layer 210 has a thickness about 3.2 millimeters. In some embodiments, the superstrate layer 210 has a thickness of 3.2 millimeters.

Continuing to refer to FIG. 2A, in some embodiments, the layered structure 200 includes an upper encapsulant layer 220. In some embodiments, the upper encapsulant layer 220 has an upper surface 222 and a lower surface 224 opposite the upper surface 222. In some embodiments, the upper surface 222 of the upper encapsulant layer 220 contacts the lower surface 214 of the superstrate layer 210. In some embodiments, the upper encapsulant layer 220 is optically transparent (e.g., it has a solar weighted transmittance of 80% or greater). In some embodiments, the upper encapsulant layer provides electrical insulation. In some embodiments, the upper encapsulant layer 220 comprises an encapsulating material such as ethylene-co-vinyl acetate ("EVA"), polydimethyl siloxane ("PDMS"), a polyolefin elastomer ("POE"), polyvinyl butyral ("PVB"), polyurethane epoxy, silicone, or an ionomer such as the series of ionomer-based encapsulants commercialized by DuPont de Nemours, Inc. under the trade name PV5400. In some embodiments, the thickness of the upper encapsulant layer 220 varies across the layered structure 200, as will be discussed in greater detail hereinafter.

Continuing to refer to FIG. 2A, in some embodiments, the layered structure 200 includes a PV layer 230 having an upper surface 232 and a lower surface 234 opposite the upper surface 232. In some embodiments, the upper surface 232 of the PV layer 230 contacts the lower surface 224 of the upper encapsulant layer 220. In some embodiments, the PV layer 230 includes at least one PV element 236. In some embodiments, the PV layer 230 includes an array of the at least one PV element 236. In some embodiments in which the PV layer 230 includes a plurality of the PV elements 236, the plurality of PV elements 236 are electrically interconnected with one another. In some embodiments, the PV layer 230 includes an array of interconnected ones of the PV elements 236. In some embodiments, gaps are formed between adjacent ones of the PV elements 236. In some embodiments, the gaps are significantly smaller than the PV elements 236; for example, in some embodiments, a width of each of the PV elements 236 is 160 millimeters and the gaps are from 2 millimeters to 5 millimeters in size. In some embodiments, the PV layer 230 also includes other active and/or passive electronic components.

Continuing to refer to FIG. 2A, in some embodiments, the layered structure 200 includes a lower encapsulant layer 240 having an upper surface 242 and a lower surface 244 opposite the upper surface 242. In some embodiments, the upper surface 242 of the lower encapsulant layer 240 contacts the lower surface 234 of the PV layer 230. In some embodiments, the lower encapsulant layer 240 provides electrical insulation. In some embodiments, the lower encapsulant layer 240 is optically transparent. In some embodiments, the lower encapsulant layer 240 is not optically transparent. In some embodiments, the thickness of the lower encapsulant layer 240 is in the range of 100 to 1000 microns. In some embodiments, the thickness of the lower encapsulant layer 240 is sufficiently large (e.g., greater than 100 microns) so as to prevent delamination between the PV layer 230 and the substrate 250. In some embodiments, the thickness of the lower encapsulant layer 240 is consistent across the entirety of the layered structure 200. In some embodiments, the lower encapsulant layer 240 comprises an encapsulating material such as ethylene-co-vinyl acetate ("EVA"), polydimethyl siloxane ("PDMS"), a polyolefin elastomer ("POE"), polyvinyl butyral ("PVB"), polyurethane epoxy, silicone, or an ionomer such as the series of ionomer-based encapsulants commercialized by DuPont de Nemours, Inc. under the trade name PV5400. In some embodiments, the lower encapsulant layer 240 comprises the same encapsulating material as the upper encapsulant layer 220.

Continuing to refer to FIG. 2A, in some embodiments, the layered structure 200 includes a substrate 250 having an upper surface 252 and a lower surface 254 opposite the upper surface 252. In some embodiments, the upper surface 252 of the substrate 250 contacts the lower surface 244 of the lower encapsulant layer 240. In some embodiments, the lower surface 254 of the substrate 250 forms the lower surface 204 of the layered structure 200. In some embodiments, the substrate 250 provides electrical insulation and moisture resistance. In some embodiments, the substrate 250 is optically transparent. In some embodiments, the substrate 250 is not optically transparent. In some embodiments, the substrate 250 comprises a glass material. In some embodiments, the substrate 250 comprises a polymeric material such as ETFE, PET, an acrylic such as PMMA, polypropylene, polyvinyl chloride ("PVC"), or a glass-reinforced or fiber-reinforced composite such as a material meeting the National Electrical Manufacturers Association ("NEMA") grades FR-4 or G-10. In some embodiments, the substrate 250 has a thickness in the range of 200 microns to ¼ inch. In some embodiments, the substrate 250 is sufficiently rigid to provide mechanical stiffening to the photovoltaic module 100.

Referring now to FIG. 2B, the layered structure 200 is shown following lamination. In some embodiments, during the lamination process, the encapsulating material of the upper encapsulant layer 220 and the encapsulating material of the lower encapsulant layer 240 are melted and flow within the gaps between adjacent ones of the PV elements 236 shown in FIG. 2A, thereby encapsulating (e.g., surrounding on all sides) each of the PV elements 236 with encapsulating material. In some embodiments, as a result of this process, the PV layer 230 includes encapsulant portions 238 located between adjacent ones of the PV elements 236, and providing continuity between the encapsulating material of the upper encapsulant layer 220 and the encapsulating material of the lower encapsulant layer 240. In some embodiments, the resulting region of the layered structure 200 (e.g., the upper encapsulant layer 220, the PV layer 230, and the lower encapsulant layer 240) resembles a single block of encapsulant material with the PV elements positioned therein.

Figure 3A:
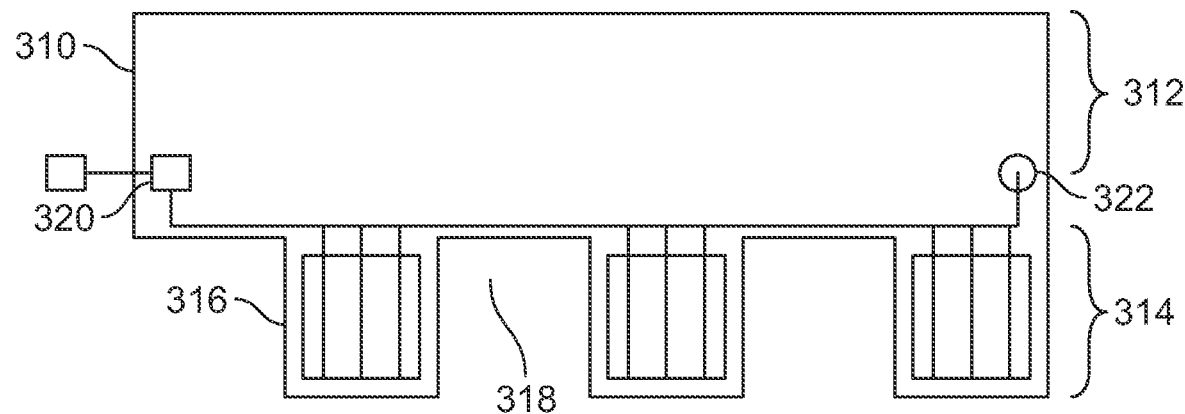
FIG. 3A shows a first module segment of an exemplary photovoltaic module.
Figure 3B:
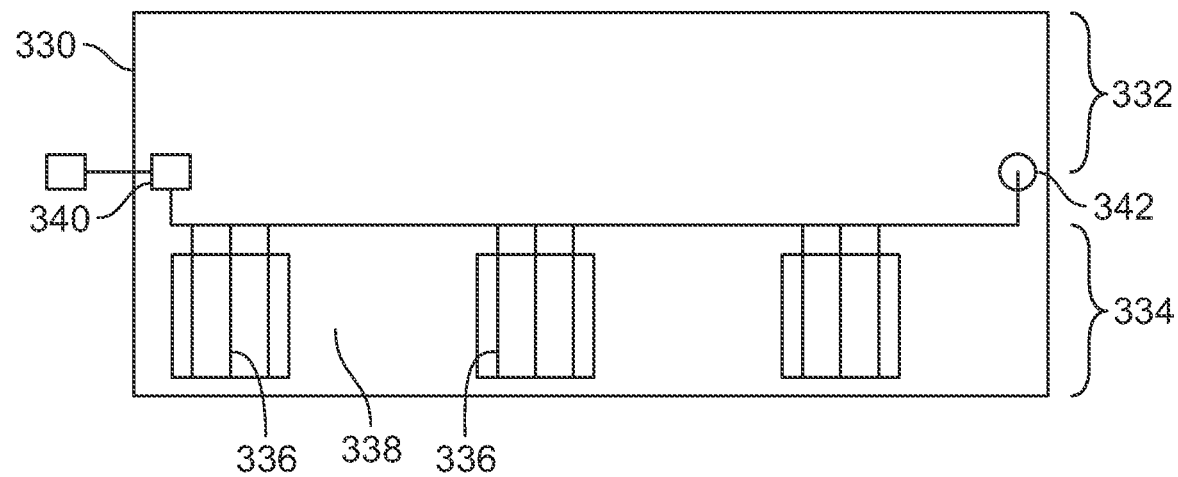
FIG. 3B shows a second module segment of an exemplary photovoltaic module.
Figure 3C:
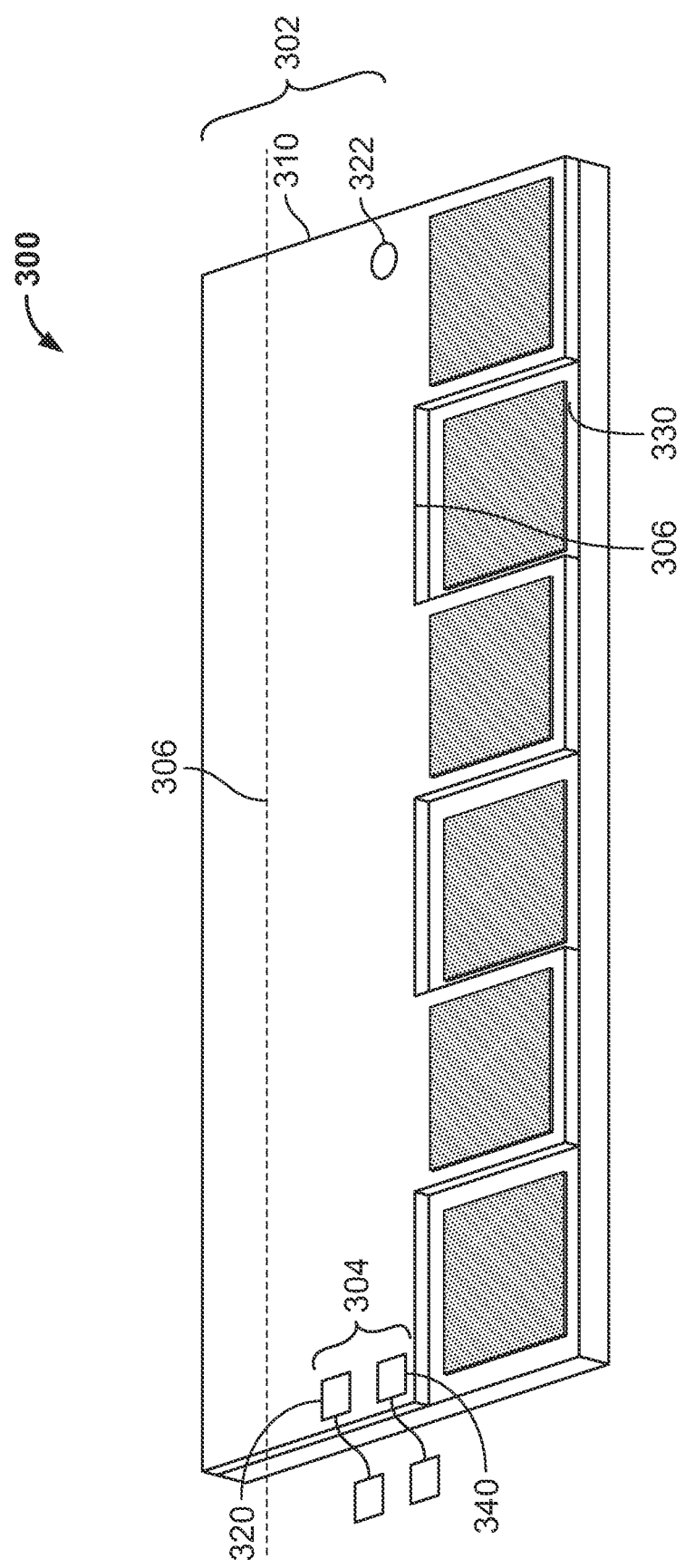
FIG. 3C shows an exemplary photovoltaic module made by combining the first module segment shown in FIG. 3A with the second module segment shown in FIG. 3B.

FIGS. 3A, 3B, and 3C show a further embodiment of a photovoltaic module 300. In some embodiments, the photovoltaic module 300 is formed by combining a first module segment 310 (shown in FIG. 3A) with a second module segment 330 (shown in FIG. 3B).

In some embodiments, the first module segment 310 includes a headlap region 312 and a PV region 314. In some embodiments, the headlap region 312 comprises TPO, PVC, or asphalt. In some embodiments, the headlap region 312 comprises embedded granules. In some embodiments, the PV region 314 includes a plurality of PV portions 316. In some embodiments, each of the PV portions 316 includes a layered structure that is typical of a laminate photovoltaic module, as discussed above with reference to FIGS. 2A and 2B. In some embodiments, the PV region 314 includes spaces 318 separating adjacent ones of the PV portions 316, such that no material (e.g., material of the headlap region 312, material of the substrate layer of the PV portions 316, etc.) is present within the spaces 318. In some embodiments, each of the PV portions 316 is deposited on a portion of material of the headlap region 312 that extends between adjacent ones of the spaces 318 (e.g., the substrate of the PV portion 316 is deposited on the material of the headlap region 312). In some embodiments, intermittent ones of the PV portions 316 and spaces 318 form an arrangement that can be referred to as a "dragontooth" arrangement. In some embodiments, the first module segment 310 includes a junction box 320 at a first end thereof and a connector 322 at an opposite second end thereof.

In some embodiments, the second module segment 330 includes a headlap region 332 and a PV region 334. In some embodiments, the headlap region 332 comprises TPO, PVC, or asphalt. In some embodiments, the headlap region 332 comprises embedded granules. In some embodiments, the PV region 334 includes a plurality of PV portions 336. In some embodiments, each of the PV portions 336 includes a layered structure that is typical of a laminate photovoltaic module, as discussed above with reference to FIGS. 2A and 2B. In some embodiments, the PV region 334 includes spaces 338 separating adjacent ones of the PV portions 336. In some embodiments, each of the spaces 338 includes at least one layer of material (e.g., material of the headlap region 332) but does not include one of the PV portions 336. In some embodiments, each of the PV portions 336 is deposited on a portion of material of the headlap region 332 that is positioned between adjacent ones of the spaces 338 (e.g., the substrate of each of the PV portions 336 is deposited on the material of the headlap region 332). In some embodiments, intermittent ones of the PV portions 336 and the spaces 338 form an arrangement that can be referred to as a "dragontooth" arrangement. In some embodiments, the second module segment 330 includes a junction box 340 at a first end thereof and a connector 342 at an opposite second end thereof.

In some embodiments, the first module segment 310 and the second module segment 330 are configured to be combined by positioning the first module segment 310 atop the second module segment 330 as shown in FIG. 3C, thereby to form the photovoltaic module 300. In some embodiments, the first module segment 310 and the second module segment 330 are combined by adhering to one another. In some embodiments, the first module segment 310 and the second module segment 330 are adhered to one another by a heat-sensitive adhesive. In some embodiments, the first module segment 310 and the second module segment 330 are adhered to one another by a pressure-sensitive adhesive. In some embodiments, the connector 322 of the first module segment 310 and the connector 342 of the second module segment 330 are positioned such that, when the first module segment 310 is positioned atop the second module segment 330, the connector 322 and the connector 342 contact one another. In some embodiments, as part of the process of combining the first module segment 310 and the second module segment 330 with one another, the connector 322 and the connector 342 are permanently electrically joined to one another (e.g., by soldering or welding). In some embodiments, once the connector 322 and the connector 342 are joined in this manner, a single circuit is created. In some embodiments, such a circuit extends through the photovoltaic module 300 from the junction box 320 of the first module segment 310, through the first module segment 310, via the electrical connection between the connector 322 and the connector 342, through the second module segment 330, and exiting the photovoltaic module 300 through the junction box 340 of the second module segment 330. In some embodiments, the junction box 320 of the first module segment 310 and the junction box 340 of the second module segment 330 are positioned and configured such that, when the first module segment 310 and the second module segment 330 are joined together as described above, the junction box 320 and the junction box 340 form a single junction box 304 for the photovoltaic module 300.

In some embodiments, the headlap region 302 (which comprises a combination of the headlap regions 312, 332 of the first module segment 310 and the second module segment 330, respectively) defines a nailing line 306 extending across the headlap region 302. In some embodiments, the nailing line 306 extends across the headlap region 302 approximately midway between the end of the headlap region 302 that borders the PV regions 314 and 334 of the first module segment 310 and the second module segment 330 respectively, and the opposite end of the headlap region 302. In some embodiments, the nailing line 306 defines an area of the headlap region 302 through which mechanical fasteners (e.g., nails, screws, etc.) can be driven to secure the photovoltaic module 300 to a roof deck in the standard manner.

In some embodiments, when the first module segment 310 and the second module segment 330 are combined in the manner described above, the headlap region 312 of the first module segment 310 is positioned atop the headlap region 332 of the second module segment 330, and consequently is planarly offset from the headlap region 332 of the second module segment 330 in a direction perpendicular to the generally planar structure of the second module segment 330. In some embodiments, due to this configuration, the PV regions 314 of the first module segment 310 are similarly planarly offset from the PV regions 334 of the second module segment 330, providing a layered "dragontooth" appearance to the photovoltaic module 300 resembling the appearance of a standard asphalt shingle.

Figure 4A:
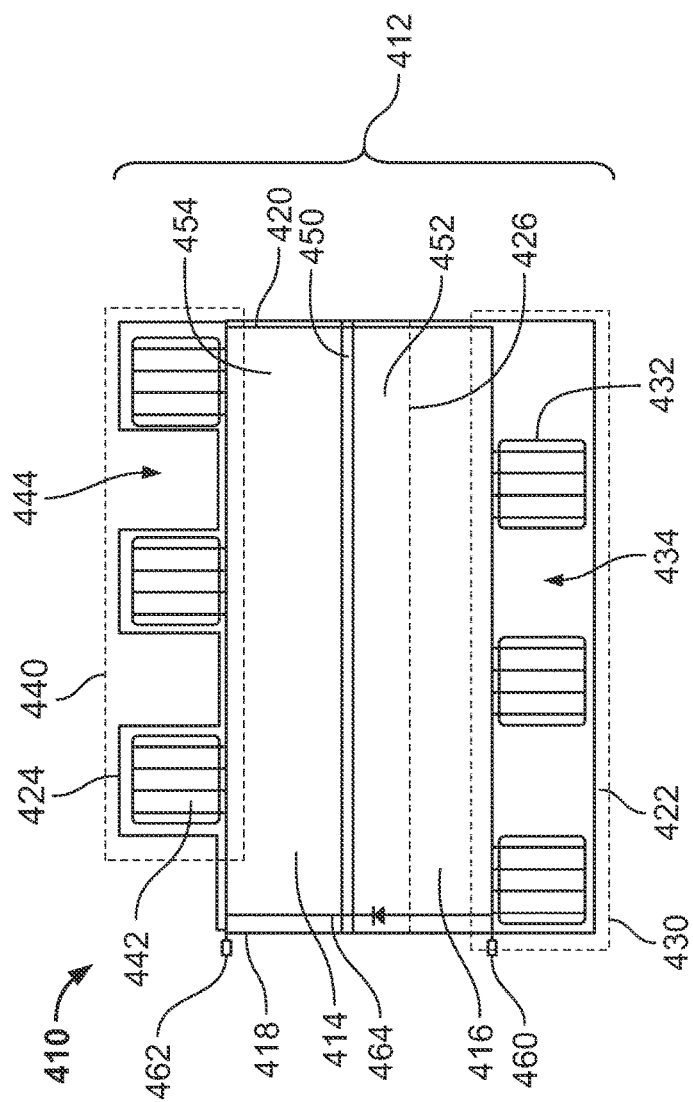
FIG. 4A shows an exemplary unfolded photovoltaic module.
Figure 4B:
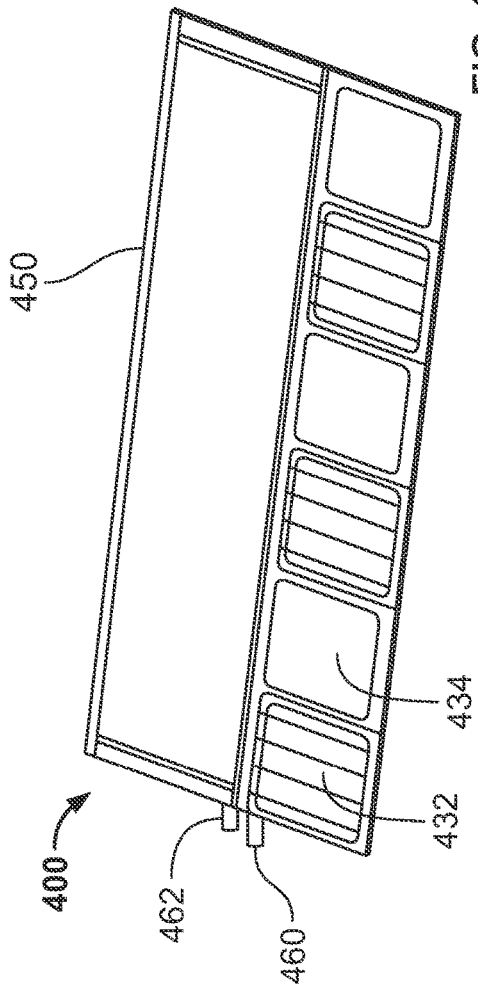
FIG. 4B shows an exemplary photovoltaic module made by folding the exemplary unfolded photovoltaic module of FIG. 4A.
Figure 5A:
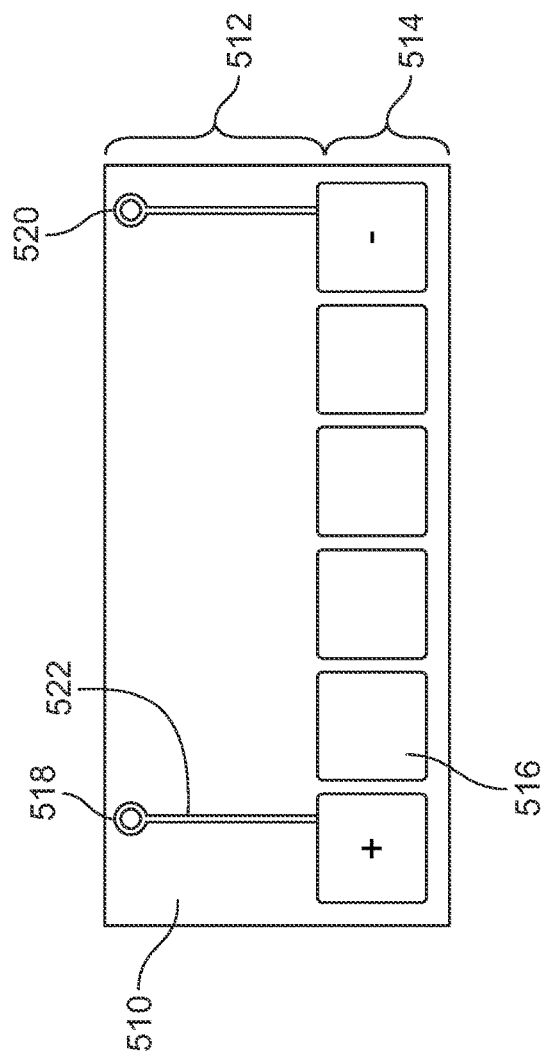
FIG. 5A shows a first module segment of an exemplary photovoltaic module.
Figure 5B:
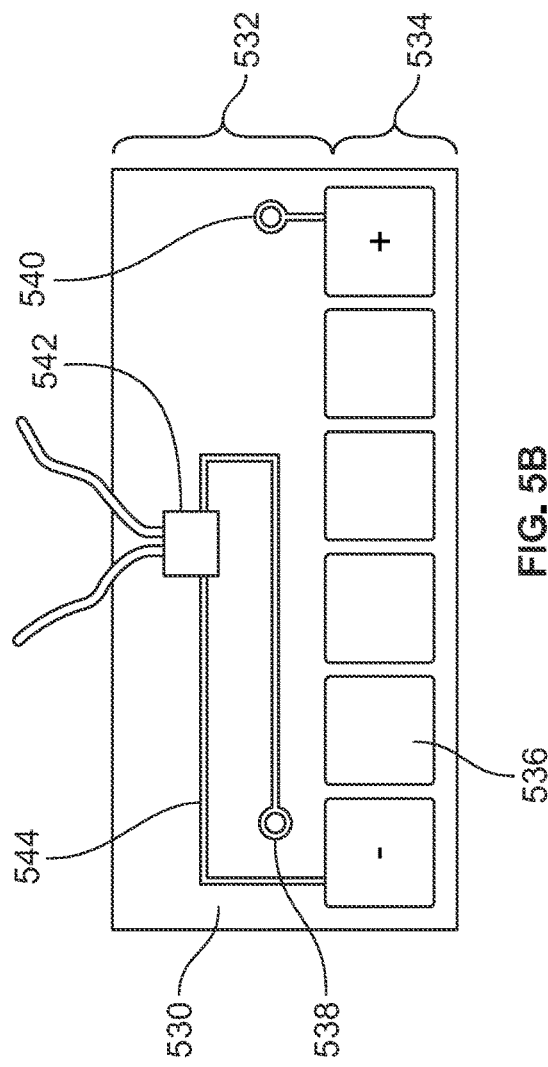
FIG. 5B shows a second module segment of an exemplary photovoltaic module.

FIGS. 4A and 4B show a further embodiment of a photovoltaic module 400. In some embodiments, the photovoltaic module 400 (shown in FIG. 4B) is formed by folding over an unfolded photovoltaic module 410 (shown in FIG. 4A).

In some embodiments, the unfolded photovoltaic module 410 includes a shingle layer 412. In some embodiments, the shingle layer 412 comprises a shingle material, such as TPO, PVC, or asphalt. In some embodiments, the shingle layer 412 comprises embedded granules. In some embodiments, the shingle layer 412 includes a first (e.g., upper) surface 414, a second (e.g., lower) surface 416 opposite the first surface 414, a first side 418, a second side 420 opposite the first side 418, a first end 422 extending from the first side 418 to the second side 420, and a second end 424 extending from the first side 418 to the second side 420 opposite the first end 422. A horizontal axis 426 is defined across the shingle layer 412 from the first side 418 to the second side 420 and parallel to the first end 422.

In some embodiments, the unfolded photovoltaic module 410 includes a first PV region 430. In some embodiments, the first PV region 430 includes a plurality of PV cells 432 disposed on the first surface 414 of the shingle layer 412, positioned proximate to the first end 422 of the shingle layer 412, and spaced intermittently along the first end 422 so as to define gaps 434 therebetween. In some embodiments, each of the gaps 434 is wider than one of the PV cells 432 (e.g., as measured in the direction along the horizontal axis 426).

In some embodiments, the unfolded photovoltaic module 410 includes a second PV region 440. In some embodiments, the second PV region 440 includes a plurality of PV cells 442 disposed on the first surface 414 of the shingle layer 412, positioned proximate to the second end 424 of the shingle layer 412, and spaced intermittently along the second end 424. In some embodiments, gaps 444 are positioned between adjacent ones of the PV cells 442. In some embodiments, the gaps 444 include cutout regions where material of the shingle layer 412 is absent. In some embodiments, the cutout regions can be referred to as a "dragontooth" arrangement. In some embodiments, each of the gaps 444 is wider than one of the PV cells 432 (e.g., as measured in the direction along the horizontal axis 426).

In some embodiments, the unfolded photovoltaic module 410 includes a fold line 450 extending across the shingle layer 412 from the first side 418 to the second side 420 parallel to the horizontal axis 426 and intermediate the first end 422 and the second end 424. In some embodiments, the fold line 450 comprises a region of the shingle layer 412 where the material of the shingle layer 412 is sufficiently flexible such that the shingle layer 412 can be folded over onto itself (e.g., as shown in FIG. 4B). In some embodiments, flexibility is imparted to the shingle layer 412 by inclusion of a region of the material of the shingle layer 412 that is thinner than surrounding regions, which may be produced by thinning techniques such as embossing, perforation, and the like. In some embodiments, flexibility is imparted to the shingle layer 412 by providing a gap in a rigid material (e.g., TPO) in which only a flexible polymeric material is present. In some embodiments, the fold line 450 subdivides the shingle layer 412 into a first region 452 between the fold line 450 and the first end 422, and a second region 454 between the fold line 450 and the second end 424.

In some embodiments, the unfolded photovoltaic module 410 includes a first junction box portion 460 adjacent to the first end 422, a second junction box portion 462 adjacent to the second end 424, and electrical connections 464 extending around the shingle layer 412 connecting the first junction box portion 460, the second junction box portion 462, the PV cells 432, and the PV cells 432, thereby forming a single electrical circuit.

In some embodiments, the unfolded photovoltaic module 410 shown in FIG. 4A can be folded by folding the shingle layer 412 at the fold line 450 to produce the photovoltaic module 400 shown in FIG. 4B. In some embodiments, the folding of the unfolded photovoltaic module 410 brings the portion of the first surface 414 that lies within the first region 452 into contact with the portion of the first surface 414 that lies within the second region 454. In some embodiments, the folding of the unfolded photovoltaic module includes adhering the portion of the first end 422 that lies within the first region 452 to the portion of the first end 422 that lies within the second region 454. In some embodiments, the adhering is performed using a heat-sensitive adhesive. In some embodiments, the adhering is performed using a pressure-sensitive adhesive.

In some embodiments, the fold line 450 of the shingle layer 412 is prepared so as to ensure that the electrical connections 464 maintain at least a minimum radius of curvature when the unfolded photovoltaic module 410 is folded to produce the photovoltaic module 400, thereby preventing fracture of the electrical connections 464 at or near the fold line 450. In some embodiments, a suitable minimum radius of curvature to maintain depends on the specific material or materials used in the electrical connections 464. In some embodiments, the shingle layer 412 includes a bead (e.g., of a polymeric material or another suitable material) at or near the fold line 450 around which the shingle layer 412 is folded to produce a suitable minimum radius of curvature. In some embodiments, the unfolded photovoltaic module 410 is folded over a mandrel or other suitable tool to maintain a suitable minimum radius of curvature while producing the photovoltaic module 400.

In some embodiments, as a result of folding the second region 454 of the shingle layer 412 over the first region 452 of the shingle layer 412, the plurality of PV cells 432 and the plurality of PV cells 442, which are located on opposite sides of the unfolded photovoltaic module 410, are oriented to face in the same "upward" direction (e.g., the direction that faces toward the sun when the photovoltaic module 400 is installed on a roof), as shown in FIG. 4B. In some embodiments, due to the thickness of the shingle layer 412, the plurality of PV cells 442 are vertically offset from the plurality of PV cells 432. In some embodiments, such an offset causes the photovoltaic module 400 to have a layered appearance similar to that of standard asphalt roof shingles.

FIGS. 5A, 5B, 5C, and 5D show a further embodiment of a photovoltaic module 500. In some embodiments, the photovoltaic module 500 is formed by combining a first module segment 510 (shown in FIG. 5A) with a second module segment 530 (shown in FIG. 5B).

In some embodiments, the first module segment 510 includes a headlap region 512 and a PV region 514. In some embodiments, the headlap region 512 comprises TPO, PVC, or asphalt. In some embodiments, the headlap region 512 comprises embedded granules. In some embodiments, the PV region 514 includes one or more PV portions 516. In some embodiments, each of the PV portions 516 includes a layered structure that is typical of a laminate photovoltaic module, as discussed above with reference to FIGS. 2A and 2B. In some embodiments, each of the PV portions 516 is deposited on a portion of material of the headlap region 512 that extends into the PV region 514 (e.g., the substrate of the PV portion 516 is deposited on the material of the headlap region 512). In some embodiments, the first module segment 310 includes a first electrical connector 518 within the headlap region 512 at a first end thereof, a second electrical connector 520 within the headlap region 512 at a second end thereof, and electrical conductors 522 extending from the first electrical connector 518, through the PV portions 516, and to the second electrical connector 520 (i.e., the electrical conductors 522 do not form a closed circuit).

In some embodiments, the second module segment 530 includes a headlap region 532 and a PV region 534. In some embodiments, the headlap region 532 comprises TPO, PVC, or asphalt. In some embodiments, the headlap region 532 comprises embedded granules. In some embodiments, the PV region 534 includes one or more PV portions 536. In some embodiments, each of the PV portions 536 includes a layered structure that is typical of a laminate photovoltaic module, as discussed above with reference to FIGS. 2A and 2B. In some embodiments, each of the PV portions 536 is deposited on a portion of material of the headlap region 532 (e.g., the substrate of each of the PV portions 536 is deposited on the material of the headlap region 532). In some embodiments, the second module segment 530 includes a first electrical connector 538 within the headlap region 532 at a first end thereof, a second electrical connector 540 within the headlap region 532 at a second end thereof, and a junction box 542. In some embodiments, the second module segment 530 includes electrical conductors 544 extending from the first electrical connector 538, through the junction box 542 and the PV portions 536, and to the second electrical connector 540 (i.e., the electrical conductors 544 do not form a closed circuit).

In some embodiments, the first module segment 510 and the second module segment 530 are configured to be combined by positioning the first module segment 510 atop the second module segment 530 as shown in FIGS. 5C and 5D, thereby to form the photovoltaic module 500. In some embodiments, the first module segment 510 and the second module segment 530 are combined by adhering to one another. In some embodiments, the first module segment 510 and the second module segment 530 are adhered to one another by a heat-sensitive adhesive. In some embodiments, the first module segment 510 and the second module segment 530 are adhered to one another by a pressure-sensitive adhesive. In some embodiments, the combining of the first module segment 510 and the second module segment 530 includes potting for moisture sealing.

In some embodiments, the first electrical connector 518 of the first module segment 510 and the first electrical connector 538 of the second module segment 530 are positioned such that, when the first module segment 510 is positioned atop the second module segment 530, the first electrical connector 518 and the first electrical connector 538 contact one another. In some embodiments, the second electrical connector 520 of the first module segment 510 and the second electrical connector 540 of the second module segment 530 are positioned such that, when the first module segment 510 is positioned atop the second module segment 530, the second electrical connector 520 and the second electrical connector 540 contact one another. In some embodiments, as part of the process of combining the first module segment 510 and the second module segment 530 with one another, the first electrical connector 518 and the first electrical connector 538 are permanently electrically joined to one another and the second electrical connector 520 and the second electrical connector 540 are permanently electrically joined to one another (e.g., by soldering or welding). In some embodiments, once the first electrical connector 518 and the first electrical connector 538 are joined together in this manner and the second electrical connector 520 and the second electrical connector 540 are joined in together this manner, a single continuous circuit is created.

In some embodiments, such a circuit extends through the photovoltaic module 500 from the junction box 542 of the second module segment 530, through a portion of the electrical conductors 544 of the second module segment 530, through the PV portions 536 of the second module segment 530, to the second electrical connector 540 of the second module segment 530, through the electrical connection between the second electrical connector 540 to the second electrical connector 520, from the second electrical connector 520 along the electrical conductors 522, through the PV portions 516 of the first module segment 510, through the electrical conductors 522 to the first electrical connector 518, through the connection between the first electrical connector 518 to the first electrical connector 538, and along the electrical conductors 544 to form a complete circuit at the junction box 542. Consequently, in some embodiments, the junction box 542 provides a single electrical connection for the photovoltaic module 500.

As shown in FIG. 5C, in some embodiments, the photovoltaic module 500 includes a headlap region 502, which comprises a combination of the headlap regions 512, 532 of the first module segment 510 and the second module segment 530, respectively. In some embodiments, the photovoltaic module 500 also includes a PV region 504, which comprises a combination of the PV regions 514, 534 of the first module segment 510 and the second module segment 530, respectively. In some embodiments, the headlap region 502 defines a nailing line 506 extending across the headlap region 502. In some embodiments, the nailing line 506 extends across the headlap region 502 approximately midway between the end of the headlap region 502 that borders the PV region 504, and the opposite end of the headlap region 502. In some embodiments, the nailing line 506 defines an area of the headlap region 502 through which mechanical fasteners (e.g., nails, screws, etc.) can be driven to secure the photovoltaic module 500 to a roof deck in the standard manner.

In some embodiments, when the first module segment 510 and the second module segment 530 are combined in the manner described above, the PV region 534 of the second module segment 530 is positioned atop a portion of the headlap region 512 of the first module segment 510, and consequently is planarly offset from the PV region 514 of the first module segment 510 in a direction perpendicular to the generally planar structure of the first module segment 510. In some embodiments, due to this offset, the offset between the PV region 534 and the PV region 514 provides a layered appearance to the photovoltaic module 500 that is similar to those of traditional shingles.

In some embodiments, an exemplary photovoltaic module (e.g., the photovoltaic module 100, the photovoltaic module 300, the photovoltaic module 400, or the photovoltaic module 500) fits both mechanically and aesthetically with standard asphalt roof shingles. In some embodiments, the layered structure of an exemplary photovoltaic module mimics the three-dimensional and water-shedding ability of a roof shingle, while providing a single electrical circuit. In some embodiments, the laminate structures of an exemplary photovoltaic module have space for in laminate bypass diodes or other module electronics without additional external connectors. In some embodiments, an exemplary photovoltaic module provides the ability to affix the photovoltaic module to a roof deck using typical roofing methods such as nails or screws.

In some embodiments, a photovoltaic system including a plurality of the photovoltaic module also includes at least one starter bar, a foot module, and a plurality of water shedding layers. In some embodiments, the at least one photovoltaic module includes an upper portion and a lower portion and is configured to be installed such that the upper portion is at a higher elevation than the lower portion. In some embodiments, the at least one starter bar is configured to be installed to a roof deck and includes a foot base. In some embodiments, a first one of the water shedding layers is configured to be installed over the foot base of the at least one starter bar, and at least one other one of the water shedding layers is configured to overlap and be installed over the first one of the plurality of water shedding layers. In some embodiments, the foot module is configured to be attached to the upper portion of the at least one solar module. In some embodiments, the lower portion of the at least one first photovoltaic module is adapted to align with the foot base of the at least one starter bar, and the foot module is configured to be affixed to a last overlapping layer of the at least one of another of the first plurality of water shedding layers to the roof deck.

Referring to FIGS. 6A and 6B, in an embodiment, a photovoltaic module 600 includes a first end 602, a second end 604 opposite the first end 602, a first side 606 extending from the first end 602 to the second end 604, a second side 608 opposite the first side 606 and extending from the first end 602 to the second end 604, a first surface 603 extending from the first end 602 to the second end 604 and from the first side 606 to the second side 608, and a second surface 605 opposite the first surface 603 and extending from the first end 602 to the second end 604 and from the first side 606 to the second side 608. In an embodiment, the photovoltaic module 600 includes at least one solar cell 610. In an embodiment, the at least one solar cell 610 includes a plurality of solar cells 610. In an embodiment, the photovoltaic module 600 includes an encapsulant 612 that encapsulates the at least one solar cell 610. In an embodiment, the encapsulant 612 includes a first surface 614 and a second surface 616. As used herein, the terms "encapsulating" and "encapsulates" mean to partially or fully envelope or enclose, and with respect to certain embodiments of the photovoltaic module 600, the at least one solar cell 610 is fully enveloped by or enclosed within the encapsulant 612, or partially enveloped by or enclosed within the encapsulant 612.

In an embodiment, the encapsulant 612 encapsulates 50% to 99.9% of an exterior surface area of the at least one solar cell 610. In another embodiment, the encapsulant 612 encapsulates 55% to 99.9% of an exterior surface area of the at least one solar cell 610. In another embodiment, the encapsulant 612 encapsulates 60% to 99.9% of an exterior surface area of the at least one solar cell 610. In another embodiment, the encapsulant 612 encapsulates 65% to 99.9% of an exterior surface area of the at least one solar cell 610. In another embodiment, the encapsulant 612 encapsulates 70% to 99.9% of an exterior surface area of the at least one solar cell 610. In another embodiment, the encapsulant 612 encapsulates 75% to 99.9% of an exterior surface area of the at least one solar cell 610. In another embodiment, the encapsulant 612 encapsulates 80% to 99.9% of an exterior surface area of the at least one solar cell 610. In another embodiment, the encapsulant 612 encapsulates 85% to 99.9% of an exterior surface area of the at least one solar cell 610. In another embodiment, the encapsulant 612 encapsulates 90% to 99.9% of an exterior surface area of the at least one solar cell 610. In another embodiment, the encapsulant 612 encapsulates 95% to 99.9% of an exterior surface area of the at least one solar cell 610.

In another embodiment, the encapsulant 612 encapsulates 50% to 95% of an exterior surface area of the at least one solar cell 610. In another embodiment, the encapsulant 612 encapsulates 55% to 95% of an exterior surface area of the at least one solar cell 610. In another embodiment, the encapsulant 612 encapsulates 60% to 95% of an exterior surface area of the at least one solar cell 610. In another embodiment, the encapsulant 612 encapsulates 65% to 95% of an exterior surface area of the at least one solar cell 610. In another embodiment, the encapsulant 612 encapsulates 70% to 95% of an exterior surface area of the at least one solar cell 610. In another embodiment, the encapsulant 612 encapsulates 75% to 95% of an exterior surface area of the at least one solar cell 610. In another embodiment, the encapsulant 612 encapsulates 80% to 95% of an exterior surface area of the at least one solar cell 610. In another embodiment, the encapsulant 612 encapsulates 85% to 95% of an exterior surface area of the at least one solar cell 610. In another embodiment, the encapsulant 612 encapsulates 90% to 95% of an exterior surface area of the at least one solar cell 610.

In another embodiment, the encapsulant 612 encapsulates 50% to 90% of an exterior surface area of the at least one solar cell 610. In another embodiment, the encapsulant 612 encapsulates 55% to 90% of an exterior surface area of the at least one solar cell 610. In another embodiment, the encapsulant 612 encapsulates 60% to 90% of an exterior surface area of the at least one solar cell 610. In another embodiment, the encapsulant 612 encapsulates 65% to 90% of an exterior surface area of the at least one solar cell 610. In another embodiment, the encapsulant 612 encapsulates 70% to 90% of an exterior surface area of the at least one solar cell 610. In another embodiment, the encapsulant 612 encapsulates 75% to 90% of an exterior surface area of the at least one solar cell 610. In another embodiment, the encapsulant 612 encapsulates 80% to 90% of an exterior surface area of the at least one solar cell 610. In another embodiment, the encapsulant 612 encapsulates 85% to 90% of an exterior surface area of the at least one solar cell 610.

In another embodiment, the encapsulant 612 encapsulates 50% to 85% of an exterior surface area of the at least one solar cell 610. In another embodiment, the encapsulant 612 encapsulates 55% to 85% of an exterior surface area of the at least one solar cell 610. In another embodiment, the encapsulant 612 encapsulates 60% to 85% of an exterior surface area of the at least one solar cell 610. In another embodiment, the encapsulant 612 encapsulates 65% to 85% of an exterior surface area of the at least one solar cell 610. In another embodiment, the encapsulant 612 encapsulates 70% to 85% of an exterior surface area of the at least one solar cell 610. In another embodiment, the encapsulant 612 encapsulates 75% to 85% of an exterior surface area of the at least one solar cell 610. In another embodiment, the encapsulant 612 encapsulates 80% to 85% of an exterior surface area of the at least one solar cell 610.

In another embodiment, the encapsulant 612 encapsulates 50% to 80% of an exterior surface area of the at least one solar cell 610. In another embodiment, the encapsulant 612 encapsulates 55% to 80% of an exterior surface area of the at least one solar cell 610. In another embodiment, the encapsulant 612 encapsulates 60% to 80% of an exterior surface area of the at least one solar cell 610. In another embodiment, the encapsulant 612 encapsulates 65% to 80% of an exterior surface area of the at least one solar cell 610. In another embodiment, the encapsulant 612 encapsulates 70% to 80% of an exterior surface area of the at least one solar cell 610. In another embodiment, the encapsulant 612 encapsulates 75% to 80% of an exterior surface area of the at least one solar cell 610.

In another embodiment, the encapsulant 612 encapsulates 50% to 75% of an exterior surface area of the at least one solar cell 610. In another embodiment, the encapsulant 612 encapsulates 55% to 75% of an exterior surface area of the at least one solar cell 610. In another embodiment, the encapsulant 612 encapsulates 60% to 75% of an exterior surface area of the at least one solar cell 610. In another embodiment, the encapsulant 612 encapsulates 65% to 75% of an exterior surface area of the at least one solar cell 610. In another embodiment, the encapsulant 612 encapsulates 70% to 75% of an exterior surface area of the at least one solar cell 610.

In another embodiment, the encapsulant 612 encapsulates 50% to 70% of an exterior surface area of the at least one solar cell 610. In another embodiment, the encapsulant 612 encapsulates 55% to 70% of an exterior surface area of the at least one solar cell 610. In another embodiment, the encapsulant 612 encapsulates 60% to 70% of an exterior surface area of the at least one solar cell 610. In another embodiment, the encapsulant 612 encapsulates 65% to 70% of an exterior surface area of the at least one solar cell 610.

In another embodiment, the encapsulant 612 encapsulates 50% to 65% of an exterior surface area of the at least one solar cell 610. In another embodiment, the encapsulant 612 encapsulates 55% to 65% of an exterior surface area of the at least one solar cell 610. In another embodiment, the encapsulant 612 encapsulates 60% to 65% of an exterior surface area of the at least one solar cell 610. In another embodiment, the encapsulant 612 encapsulates 50% to 60% of an exterior surface area of the at least one solar cell 610. In another embodiment, the encapsulant 612 encapsulates 55% to 60% of an exterior surface area of the at least one solar cell 610. In another embodiment, the encapsulant 612 encapsulates 55% to 60% of an exterior surface area of the at least one solar cell 610.

In an embodiment, the encapsulant 612 encapsulates 50% of an exterior surface area of the at least one solar cell 610. In another embodiment, the encapsulant 612 encapsulates 55% of the exterior surface area of the at least one solar cell 610. In another embodiment, the encapsulant 612 encapsulates 60% of the exterior surface area of the at least one solar cell 610. In another embodiment, the encapsulant 612 encapsulates 65% of the exterior surface area of the at least one solar cell 610. In another embodiment, the encapsulant 612 encapsulates 70% of the exterior surface area of the at least one solar cell 610. In another embodiment, the encapsulant 612 encapsulates 75% of the exterior surface area of the at least one solar cell 610. In another embodiment, the encapsulant 612 encapsulates 80% of the exterior surface area of the at least one solar cell 610. In another embodiment, the encapsulant 612 encapsulates 85% of the exterior surface area of the at least one solar cell 610. In another embodiment, the encapsulant 612 encapsulates 90% of the exterior surface area of the at least one solar cell 610. In another embodiment, the encapsulant 612 encapsulates 95% of the exterior surface area of the at least one solar cell 610. In another embodiment, the encapsulant 612 encapsulates 100% of the exterior surface area of the at least one solar cell 610.

In an embodiment, the encapsulant 612 may be made from polyolefins, ethyl vinyl acetates, ionomers, silicones, poly vinyl butyral, epoxies, polyurethanes, or combinations/hybrids thereof.

In an embodiment, the encapsulant 612 has a thickness of 0.4 mm to 1.8 mm. In another embodiment, the encapsulant 612 has a thickness of 0.4 mm to 1.7 mm. In another embodiment, the encapsulant 612 has a thickness of 0.4 mm to 1.6 mm. In another embodiment, the encapsulant 612 has a thickness of 0.4 mm to 1.5 mm. In another embodiment, the encapsulant 612 has a thickness of 0.4 mm to 1.4 mm. In another embodiment, the encapsulant 612 has a thickness of 0.4 mm to 1.3 mm. In another embodiment, the encapsulant 612 has a thickness of 0.4 mm to 1.2 mm. In another embodiment, the encapsulant 612 has a thickness of 0.4 mm to 1.1 mm. In another embodiment, the encapsulant 612 has a thickness of 0.4 mm to 1.0 mm. In another embodiment, the encapsulant 612 has a thickness of 0.4 mm to 0.9 mm. In another embodiment, the encapsulant 612 has a thickness of 0.4 mm to 0.8 mm. In another embodiment, the encapsulant 612 has a thickness of 0.4 mm to 0.7 mm. In another embodiment, the encapsulant 612 has a thickness of 0.4 mm to 0.6 mm. In another embodiment, the encapsulant 612 has a thickness of 0.4 mm to 0.5 mm.

In an embodiment, the encapsulant 612 has a thickness of 0.5 mm to 1.8 mm. In another embodiment, the encapsulant 612 has a thickness of 0.5 mm to 1.7 mm. In another embodiment, the encapsulant 612 has a thickness of 0.5 mm to 1.6 mm. In another embodiment, the encapsulant 612 has a thickness of 0.5 mm to 1.5 mm. In another embodiment, the encapsulant 612 has a thickness of 0.5 mm to 1.4 mm. In another embodiment, the encapsulant 612 has a thickness of 0.5 mm to 1.3 mm. In another embodiment, the encapsulant 612 has a thickness of 0.5 mm to 1.2 mm. In another embodiment, the encapsulant 612 has a thickness of 0.5 mm to 1.1 mm. In another embodiment, the encapsulant 612 has a thickness of 0.5 mm to 1.0 mm. In another embodiment, the encapsulant 612 has a thickness of 0.5 mm to 0.9 mm. In another embodiment, the encapsulant 612 has a thickness of 0.5 mm to 0.8 mm. In another embodiment, the encapsulant 612 has a thickness of 0.5 mm to 0.7 mm. In another embodiment, the encapsulant 612 has a thickness of 0.5 mm to 0.6 mm.

In an embodiment, the encapsulant 612 has a thickness of 0.6 mm to 1.8 mm. In another embodiment, the encapsulant 612 has a thickness of 0.6 mm to 1.7 mm. In another embodiment, the encapsulant 612 has a thickness of 0.6 mm to 1.6 mm. In another embodiment, the encapsulant 612 has a thickness of 0.6 mm to 1.5 mm. In another embodiment, the encapsulant 612 has a thickness of 0.6 mm to 1.4 mm. In another embodiment, the encapsulant 612 has a thickness of 0.6 mm to 1.3 mm. In another embodiment, the encapsulant 612 has a thickness of 0.6 mm to 1.2 mm. In another embodiment, the encapsulant 612 has a thickness of 0.6 mm to 1.1 mm. In another embodiment, the encapsulant 612 has a thickness of 0.6 mm to 1.0 mm. In another embodiment, the encapsulant 612 has a thickness of 0.6 mm to 0.9 mm. In another embodiment, the encapsulant 612 has a thickness of 0.6 mm to 0.8 mm. In another embodiment, the encapsulant 612 has a thickness of 0.6 mm to 0.7 mm.

In an embodiment, the encapsulant 612 has a thickness of 0.7 mm to 1.8 mm. In another embodiment, the encapsulant 612 has a thickness of 0.7 mm to 1.7 mm. In another embodiment, the encapsulant 612 has a thickness of 0.7 mm to 1.6 mm. In another embodiment, the encapsulant 612 has a thickness of 0.7 mm to 1.5 mm. In another embodiment, the encapsulant 612 has a thickness of 0.7 mm to 1.4 mm. In another embodiment, the encapsulant 612 has a thickness of 0.7 mm to 1.3 mm. In another embodiment, the encapsulant 612 has a thickness of 0.7 mm to 1.2 mm. In another embodiment, the encapsulant 612 has a thickness of 0.7 mm to 1.1 mm. In another embodiment, the encapsulant 612 has a thickness of 0.7 mm to 1.0 mm. In another embodiment, the encapsulant 612 has a thickness of 0.7 mm to 0.9 mm. In another embodiment, the encapsulant 612 has a thickness of 0.7 mm to 0.8 mm.

In an embodiment, the encapsulant 612 has a thickness of 0.8 mm to 1.8 mm. In another embodiment, the encapsulant 612 has a thickness of 0.8 mm to 1.7 mm. In another embodiment, the encapsulant 612 has a thickness of 0.8 mm to 1.6 mm. In another embodiment, the encapsulant 612 has a thickness of 0.8 mm to 1.5 mm. In another embodiment, the encapsulant 612 has a thickness of 0.8 mm to 1.4 mm. In another embodiment, the encapsulant 612 has a thickness of 0.8 mm to 1.3 mm. In another embodiment, the encapsulant 612 has a thickness of 0.8 mm to 1.2 mm. In another embodiment, the encapsulant 612 has a thickness of 0.8 mm to 1.1 mm. In another embodiment, the encapsulant 612 has a thickness of 0.8 mm to 1.0 mm. In another embodiment, the encapsulant 612 has a thickness of 0.8 mm to 0.9 mm.

In an embodiment, the encapsulant 612 has a thickness of 0.9 mm to 1.8 mm. In another embodiment, the encapsulant 612 has a thickness of 0.9 mm to 1.7 mm. In another embodiment, the encapsulant 612 has a thickness of 0.9 mm to 1.6 mm. In another embodiment, the encapsulant 612 has a thickness of 0.9 mm to 1.5 mm. In another embodiment, the encapsulant 612 has a thickness of 0.9 mm to 1.4 mm. In another embodiment, the encapsulant 612 has a thickness of 0.9 mm to 1.3 mm. In another embodiment, the encapsulant 612 has a thickness of 0.9 mm to 1.2 mm. In another embodiment, the encapsulant 612 has a thickness of 0.9 mm to 1.1 mm. In another embodiment, the encapsulant 612 has a thickness of 0.9 mm to 1.0 mm.

In an embodiment, the encapsulant 612 has a thickness of 1.0 mm to 1.8 mm. In another embodiment, the encapsulant 612 has a thickness of 1.0 mm to 1.7 mm. In another embodiment, the encapsulant 612 has a thickness of 1.0 mm to 1.6 mm. In another embodiment, the encapsulant 612 has a thickness of 1.0 mm to 1.5 mm. In another embodiment, the encapsulant 612 has a thickness of 1.0 mm to 1.4 mm. In another embodiment, the encapsulant 612 has a thickness of 1.0 mm to 1.3 mm. In another embodiment, the encapsulant 612 has a thickness of 1.0 mm to 1.2 mm. In another embodiment, the encapsulant 612 has a thickness of 1.0 mm to 1.1 mm.

In an embodiment, the encapsulant 612 has a thickness of 1.1 mm to 1.8 mm. In another embodiment, the encapsulant 612 has a thickness of 1.1 mm to 1.7 mm. In another embodiment, the encapsulant 612 has a thickness of 1.1 mm to 1.6 mm. In another embodiment, the encapsulant 612 has a thickness of 1.1 mm to 1.5 mm. In another embodiment, the encapsulant 612 has a thickness of 1.1 mm to 1.4 mm. In another embodiment, the encapsulant 612 has a thickness of 1.1 mm to 1.3 mm. In another embodiment, the encapsulant 612 has a thickness of 1.1 mm to 1.2 mm.

In an embodiment, the encapsulant 612 has a thickness of 1.2 mm to 1.8 mm. In another embodiment, the encapsulant 612 has a thickness of 1.2 mm to 1.7 mm. In another embodiment, the encapsulant 612 has a thickness of 1.2 mm to 1.6 mm. In another embodiment, the encapsulant 612 has a thickness of 1.2 mm to 1.5 mm. In another embodiment, the encapsulant 612 has a thickness of 1.2 mm to 1.4 mm. In another embodiment, the encapsulant 612 has a thickness of 1.2 mm to 1.3 mm.

In an embodiment, the encapsulant 612 has a thickness of 1.3 mm to 1.8 mm. In another embodiment, the encapsulant 612 has a thickness of 1.3 mm to 1.7 mm. In another embodiment, the encapsulant 612 has a thickness of 1.3 mm to 1.6 mm. In another embodiment, the encapsulant 612 has a thickness of 1.3 mm to 1.5 mm. In another embodiment, the encapsulant 612 has a thickness of 1.3 mm to 1.4 mm.

In an embodiment, the encapsulant 612 has a thickness of 1.4 mm to 1.8 mm. In another embodiment, the encapsulant 612 has a thickness of 1.4 mm to 1.7 mm. In another embodiment, the encapsulant 612 has a thickness of 1.4 mm to 1.6 mm. In another embodiment, the encapsulant 612 has a thickness of 1.4 mm to 1.5 mm.

In an embodiment, the encapsulant 612 has a thickness of 1.5 mm to 1.8 mm. In another embodiment, the encapsulant 612 has a thickness of 1.5 mm to 1.7 mm. In another embodiment, the encapsulant 612 has a thickness of 1.5 mm to 1.6 mm. In an embodiment, the encapsulant 612 has a thickness of 1.6 mm to 1.8 mm. In another embodiment, the encapsulant 612 has a thickness of 1.6 mm to 1.7 mm. In an embodiment, the encapsulant 612 has a thickness of 1.7 mm to 1.8 mm. In an embodiment, the encapsulant 612 has a thickness of 0.4 mm. In an embodiment, the encapsulant 612 has a thickness of 0.5 mm. In an embodiment, the encapsulant 612 has a thickness of 0.6 mm. In an embodiment, the encapsulant 612 has a thickness of 0.7 mm. In an embodiment, the encapsulant 612 has a thickness of 0.8 mm. In an embodiment, the encapsulant 612 has a thickness of 0.9 mm. In an embodiment, the encapsulant 612 has a thickness of 1.0 mm. In an embodiment, the encapsulant 612 has a thickness of 1.1 mm. In an embodiment, the encapsulant 612 has a thickness of 1.2 mm. In an embodiment, the encapsulant 612 has a thickness of 1.3 mm. In an embodiment, the encapsulant 612 has a thickness of 1.4 mm. In an embodiment, the encapsulant 612 has a thickness of 1.5 mm. In an embodiment, the encapsulant 612 has a thickness of 1.6 mm. In an embodiment, the encapsulant 612 has a thickness of 1.7 mm. In an embodiment, the encapsulant 612 has a thickness of 1.8 mm.

In an embodiment, the photovoltaic module 600 includes a frontsheet 618 juxtaposed with the first surface 614 of the encapsulant 612, and a backsheet 620 juxtaposed with the second surface 616 of the encapsulant 612. In an embodiment, each of the frontsheet 618 and the backsheet 620 includes a polymer. In an embodiment, each of the frontsheet 618 and the backsheet 620 includes thermoplastic polyolefin (TPO). In other embodiments, each of the frontsheet 618 and the backsheet 620 includes polyethylene terephthalate (PET), polyethylene naphthalate (PEN), polyetheretherketone (PEEK), polyaryletherketone (PAEK), polyarylate (PAR), polyetherimide (PEI), polyarylsulfone (PAS), polyethersulfone (PES), polyamideimide (PAI), or polyimide; polyvinyl chloride (PVC); ethylene propylene diene monomer (EPDM) rubber; silicone rubber; fluoropolymers-ethylene tetrafluoroethylene (ETFE), polyvinylidene fluoride (PVDF), tetrafluoroethylene-hexafluoropropylene copolymers (FEP), and tetrafluoroethylene-hexafluoropropylene-vinylidene fluoride copolymers (THV), or blends thereof. In an embodiment, each of the frontsheet 618 and the backsheet 620 is made from a polymer-based dielectric material.

In an embodiment, the frontsheet 618 includes a glass layer 611 and a polymer layer 613 attached to a first surface of the glass layer 611. In an embodiment, the frontsheet 618 is juxtaposed with the first surface 614 of the encapsulant 612. In an embodiment, each of the encapsulant 612, the glass layer 611, and the polymer layer 613 is transparent. In an embodiment, the polymer layer 613 is attached to the glass layer 611 by an adhesive layer 615. In an embodiment, the adhesive layer 615 may include polyvinyl butyrate, acrylic, silicone, or polycarbonate. In another embodiment, the adhesive layer 615 may include pressure sensitive adhesives. In another embodiment, the polymer layer 613 is attached to the glass layer 611 by thermal bonding. In another embodiment, the frontsheet 618 includes at least one of the glass layer 611 or the polymer layer 613. In an embodiment, the adhesive layer 615 is transparent. As used herein, the term "transparent" means having a solar weighted transmittance of 80% or greater, and with respect to certain embodiments of the photovoltaic module 600, a transparent layer of the photovoltaic module has a solar weighted transmittance of 80% or greater.

In an embodiment, the glass layer 611 has a thickness of 2.5 mm to 4 mm. In another embodiment, the glass layer 611 has a thickness of 2.5 mm to 3.5 mm. In another embodiment, the glass layer 611 has a thickness of 2.5 mm to 3 mm. In another embodiment, the glass layer 611 has a thickness of 3 mm to 4 mm. In another embodiment, the glass layer 611 has a thickness of 3.5 mm to 4 mm. In another embodiment, the glass layer 611 has a thickness of 2.6 mm to 3.5 mm. In another embodiment, the glass layer 611 has a thickness of 2.7 mm to 3.5 mm. In another embodiment, the glass layer 611 has a thickness of 2.8 mm to 3.5 mm. In another embodiment, the glass layer 611 has a thickness of 2.9 mm to 3.5 mm. In another embodiment, the glass layer 611 has a thickness of 3 mm to 3.5 mm. In another embodiment, the glass layer 611 has a thickness of 3.1 mm to 3.5 mm. In another embodiment, the glass layer 611 has a thickness of 3.2 mm to 3.5 mm. In another embodiment, the glass layer 611 has a thickness of 3.3 mm to 3.5 mm. In another embodiment, the glass layer 611 has a thickness of 3.4 mm to 3.5 mm. In another embodiment, the glass layer 611 has a thickness of 2.5 mm to 3.4 mm. In another embodiment, the glass layer 611 has a thickness of 2.5 mm to 3.3 mm. In another embodiment, the glass layer 611 has a thickness of 2.5 mm to 3.2 mm. In another embodiment, the glass layer 611 has a thickness of 2.5 mm to 3.1 mm. In another embodiment, the glass layer 611 has a thickness of 2.5 mm to 2.9 mm. In another embodiment, the glass layer 611 has a thickness of 2.5 mm to 2.8 mm. In another embodiment, the glass layer 611 has a thickness of 2.5 mm to 2.7 mm. In another embodiment, the glass layer 611 has a thickness of 2.5 mm to 2.6 mm.

In another embodiment, the glass layer 611 has a thickness of 2.5 mm. In another embodiment, the glass layer 611 has a thickness of 2.6 mm. In another embodiment, the glass layer 611 has a thickness of 2.7 mm. In another embodiment, the glass layer 611 has a thickness of 2.8 mm. In another embodiment, the glass layer 611 has a thickness of 2.9 mm. In another embodiment, the glass layer 611 has a thickness of 3 mm. In another embodiment, the glass layer 611 has a thickness of 3.1 mm. In another embodiment, the glass layer 611 has a thickness of 3.2 mm. In another embodiment, the glass layer 611 has a thickness of 3.3 mm. In another embodiment, the glass layer 611 has a thickness of 3.4 mm. In another embodiment, the glass layer 611 has a thickness of 3.5 mm. In another embodiment, the glass layer 611 has a thickness of 3.6 mm. In another embodiment, the glass layer 611 has a thickness of 3.7 mm. In another embodiment, the glass layer 611 has a thickness of 3.8 mm. In another embodiment, the glass layer 611 has a thickness of 3.9 mm. In another embodiment, the glass layer 611 has a thickness of 4 mm.

In an embodiment, the adhesive layer 615 includes thermosetting polyolefin, thermosetting polyolefin encapsulant material, thermosetting ethylene-vinyl acetate (EVA), EVA encapsulants, thermoplastic olefin, thermoplastic polyolefin (TOP) or hybrids/combinations thereof.

In an embodiment, the adhesive layer 615 has a thickness of 1 μm to 900 μm. In an embodiment, the adhesive layer 615 has a thickness of 1 μm to 900 μm. In an embodiment, the adhesive layer 615 has a thickness of 1 μm to 850 μm. In an embodiment, the adhesive layer 615 has a thickness of 1 μm to 800 μm. In an embodiment, the adhesive layer 615 has a thickness of 1 μm to 750 μm. In an embodiment, the adhesive layer 615 has a thickness of 1 μm to 700 μm. In an embodiment, the adhesive layer 615 has a thickness of 1 μm to 650 μm. In an embodiment, the adhesive layer 615 has a thickness of 1 μm to 600 μm. In an embodiment, the adhesive layer 615 has a thickness of 1 μm to 550 μm. In an embodiment, the adhesive layer 615 has a thickness of 1 μm to 500 μm. In an embodiment, the adhesive layer 615 has a thickness of 1 μm to 450 μm. In an embodiment, the adhesive layer 615 has a thickness of 1 μm to 400 μm. In an embodiment, the adhesive layer 615 has a thickness of 1 μm to 350 μm. In an embodiment, the adhesive layer 615 has a thickness of 1 μm to 300 μm. In an embodiment, the adhesive layer 615 has a thickness of 1 μm to 250 μm. In an embodiment, the adhesive layer 615 has a thickness of 1 μm to 200 μm. In an embodiment, the adhesive layer 615 has a thickness of 1 μm to 150 μm. In an embodiment, the adhesive layer 615 has a thickness of 1 μm to 100 μm. In an embodiment, the adhesive layer 615 has a thickness of 1 μm to 50 μm.

In an embodiment, the adhesive layer 615 has a thickness of 50 μm to 900 μm. In an embodiment, the adhesive layer 615 has a thickness of 50 μm to 850 μm. In an embodiment, the adhesive layer 615 has a thickness of 50 μm to 800 μm. In an embodiment, the adhesive layer 615 has a thickness of 50 μm to 750 μm. In an embodiment, the adhesive layer 615 has a thickness of 50 μm to 700 μm. In an embodiment, the adhesive layer 615 has a thickness of 50 μm to 650 μm. In an embodiment, the adhesive layer 615 has a thickness of 50 μm to 600 μm. In an embodiment, the adhesive layer 615 has a thickness of 50 μm to 550 μm. In an embodiment, the adhesive layer 615 has a thickness of 50 μm to 500 μm. In an embodiment, the adhesive layer 615 has a thickness of 50 μm to 450 μm. In an embodiment, the adhesive layer 615 has a thickness of 50 µm to 400 µm. In an embodiment, the adhesive layer 615 has a thickness of 50 µm to 350 µm. In an embodiment, the adhesive layer 615 has a thickness of 50 µm to 300 µm. In an embodiment, the adhesive layer 615 has a thickness of 50 µm to 250 µm. In an embodiment, the adhesive layer 615 has a thickness of 50 µm to 200 µm. In an embodiment, the adhesive layer 615 has a thickness of 50 µm to 150 µm. In an embodiment, the adhesive layer 615 has a thickness of 50 µm to 100 µm.

In an embodiment, the adhesive layer 615 has a thickness of 100 µm to 900 µm. In an embodiment, the adhesive layer 615 has a thickness of 100 µm to 850 µm. In an embodiment, the adhesive layer 615 has a thickness of 100 µm to 800 µm. In an embodiment, the adhesive layer 615 has a thickness of 100 µm to 750 µm. In an embodiment, the adhesive layer 615 has a thickness of 100 µm to 700 µm. In an embodiment, the adhesive layer 615 has a thickness of 100 µm to 650 µm. In an embodiment, the adhesive layer 615 has a thickness of 100 µm to 600 µm. In an embodiment, the adhesive layer 615 has a thickness of 100 µm to 550 µm. In an embodiment, the adhesive layer 615 has a thickness of 100 µm to 500 µm. In an embodiment, the adhesive layer 615 has a thickness of 100 µm to 450 µm. In an embodiment, the adhesive layer 615 has a thickness of 100 µm to 400 µm. In an embodiment, the adhesive layer 615 has a thickness of 100 µm to 350 µm. In an embodiment, the adhesive layer 615 has a thickness of 100 µm to 300 µm. In an embodiment, the adhesive layer 615 has a thickness of 100 µm to 250 µm. In an embodiment, the adhesive layer 615 has a thickness of 100 µm to 200 µm. In an embodiment, the adhesive layer 615 has a thickness of 100 µm to 150 µm.

In an embodiment, the adhesive layer 615 has a thickness of 150 µm to 900 µm. In an embodiment, the adhesive layer 615 has a thickness of 150 µm to 850 µm. In an embodiment, the adhesive layer 615 has a thickness of 150 µm to 800 µm. In an embodiment, the adhesive layer 615 has a thickness of 150 µm to 750 µm. In an embodiment, the adhesive layer 615 has a thickness of 150 µm to 700 µm. In an embodiment, the adhesive layer 615 has a thickness of 150 µm to 650 µm. In an embodiment, the adhesive layer 615 has a thickness of 150 µm to 600 µm. In an embodiment, the adhesive layer 615 has a thickness of 150 µm to 550 µm. In an embodiment, the adhesive layer 615 has a thickness of 150 µm to 500 µm. In an embodiment, the adhesive layer 615 has a thickness of 150 µm to 450 µm. In an embodiment, the adhesive layer 615 has a thickness of 150 µm to 400 µm. In an embodiment, the adhesive layer 615 has a thickness of 150 µm to 350 µm. In an embodiment, the adhesive layer 615 has a thickness of 150 µm to 300 µm. In an embodiment, the adhesive layer 615 has a thickness of 150 µm to 250 µm. In an embodiment, the adhesive layer 615 has a thickness of 150 µm to 200 µm.

In an embodiment, the adhesive layer 615 has a thickness of 200 µm to 900 µm. In an embodiment, the adhesive layer 615 has a thickness of 200 µm to 850 µm. In an embodiment, the adhesive layer 615 has a thickness of 200 µm to 800 µm. In an embodiment, the adhesive layer 615 has a thickness of 200 µm to 750 µm. In an embodiment, the adhesive layer 615 has a thickness of 200 µm to 700 µm. In an embodiment, the adhesive layer 615 has a thickness of 200 µm to 650 µm. In an embodiment, the adhesive layer 615 has a thickness of 200 µm to 600 µm. In an embodiment, the adhesive layer 615 has a thickness of 200 µm to 550 µm. In an embodiment, the adhesive layer 615 has a thickness of 200 µm to 500 µm. In an embodiment, the adhesive layer 615 has a thickness of 200 µm to 450 µm. In an embodiment, the adhesive layer 615 has a thickness of 200 µm to 400 µm. In an embodiment, the adhesive layer 615 has a thickness of 200 µm to 350 µm. In an embodiment, the adhesive layer 615 has a thickness of 200 µm to 300 µm. In an embodiment, the adhesive layer 615 has a thickness of 200 µm to 250 µm.

In an embodiment, the adhesive layer 615 has a thickness of 250 µm to 900 µm. In an embodiment, the adhesive layer 615 has a thickness of 250 µm to 850 µm. In an embodiment, the adhesive layer 615 has a thickness of 250 µm to 800 µm. In an embodiment, the adhesive layer 615 has a thickness of 250 µm to 750 µm. In an embodiment, the adhesive layer 615 has a thickness of 250 µm to 700 µm. In an embodiment, the adhesive layer 615 has a thickness of 250 µm to 650 µm. In an embodiment, the adhesive layer 615 has a thickness of 250 µm to 600 µm. In an embodiment, the adhesive layer 615 has a thickness of 250 µm to 550 µm. In an embodiment, the adhesive layer 615 has a thickness of 250 µm to 500 µm. In an embodiment, the adhesive layer 615 has a thickness of 250 µm to 450 µm. In an embodiment, the adhesive layer 615 has a thickness of 250 µm to 400 µm. In an embodiment, the adhesive layer 615 has a thickness of 250 µm to 350 µm. In an embodiment, the adhesive layer 615 has a thickness of 250 µm to 300 µm.

In an embodiment, the adhesive layer 615 has a thickness of 300 µm to 900 µm. In an embodiment, the adhesive layer 615 has a thickness of 300 µm to 850 µm. In an embodiment, the adhesive layer 615 has a thickness of 300 µm to 800 µm. In an embodiment, the adhesive layer 615 has a thickness of 300 µm to 750 µm. In an embodiment, the adhesive layer 615 has a thickness of 300 µm to 700 µm. In an embodiment, the adhesive layer 615 has a thickness of 300 µm to 650 µm. In an embodiment, the adhesive layer 615 has a thickness of 300 µm to 600 µm. In an embodiment, the adhesive layer 615 has a thickness of 300 µm to 550 µm. In an embodiment, the adhesive layer 615 has a thickness of 300 µm to 500 µm. In an embodiment, the adhesive layer 615 has a thickness of 300 µm to 450 µm. In an embodiment, the adhesive layer 615 has a thickness of 300 µm to 400 µm. In an embodiment, the adhesive layer 615 has a thickness of 300 µm to 350 µm.

In an embodiment, the adhesive layer 615 has a thickness of 350 µm to 900 µm. In an embodiment, the adhesive layer 615 has a thickness of 350 µm to 850 µm. In an embodiment, the adhesive layer 615 has a thickness of 350 µm to 800 µm. In an embodiment, the adhesive layer 615 has a thickness of 350 µm to 750 µm. In an embodiment, the adhesive layer 615 has a thickness of 350 µm to 700 µm. In an embodiment, the adhesive layer 615 has a thickness of 350 µm to 650 µm. In an embodiment, the adhesive layer 615 has a thickness of 350 µm to 600 µm. In an embodiment, the adhesive layer 615 has a thickness of 350 µm to 550 µm. In an embodiment, the adhesive layer 615 has a thickness of 350 µm to 500 µm. In an embodiment, the adhesive layer 615 has a thickness of 350 µm to 450 µm. In an embodiment, the adhesive layer 615 has a thickness of 350 µm to 400 µm.

In an embodiment, the adhesive layer 615 has a thickness of 400 µm to 900 µm. In an embodiment, the adhesive layer 615 has a thickness of 400 µm to 850 µm. In an embodiment, the adhesive layer 615 has a thickness of 400 µm to 800 µm. In an embodiment, the adhesive layer 615 has a thickness of 400 µm to 750 µm. In an embodiment, the adhesive layer 615 has a thickness of 400 µm to 700 µm. In an embodiment, the adhesive layer 615 has a thickness of 400 µm to 650 µm. In an embodiment, the adhesive layer 615 has a thickness of 400 µm to 600 µm. In an embodiment, the adhesive layer 615 has a thickness of 400 µm to 550 µm. In an embodiment, the adhesive layer 615 has a thickness of 400 µm to 500 µm. In an embodiment, the adhesive layer 615 has a thickness of 400 µm to 450 µm.

In an embodiment, the adhesive layer 615 has a thickness of 450 μm to 900 μm. In an embodiment, the adhesive layer 615 has a thickness of 450 μm to 850 μm. In an embodiment, the adhesive layer 615 has a thickness of 450 μm to 800 μm. In an embodiment, the adhesive layer 615 has a thickness of 450 μm to 750 μm. In an embodiment, the adhesive layer 615 has a thickness of 450 μm to 700 μm. In an embodiment, the adhesive layer 615 has a thickness of 450 μm to 650 μm. In an embodiment, the adhesive layer 615 has a thickness of 450 μm to 600 μm. In an embodiment, the adhesive layer 615 has a thickness of 450 μm to 550 μm. In an embodiment, the adhesive layer 615 has a thickness of 450 μm to 500 μm.

In an embodiment, the adhesive layer 615 has a thickness of 500 μm to 900 μm. In an embodiment, the adhesive layer 615 has a thickness of 500 μm to 850 μm. In an embodiment, the adhesive layer 615 has a thickness of 500 μm to 800 μm. In an embodiment, the adhesive layer 615 has a thickness of 500 μm to 750 μm. In an embodiment, the adhesive layer 615 has a thickness of 500 μm to 700 μm. In an embodiment, the adhesive layer 615 has a thickness of 500 μm to 650 μm. In an embodiment, the adhesive layer 615 has a thickness of 500 μm to 600 μm. In an embodiment, the adhesive layer 615 has a thickness of 500 μm to 550 μm.

In an embodiment, the adhesive layer 615 has a thickness of 550 μm to 900 μm. In an embodiment, the adhesive layer 615 has a thickness of 550 μm to 850 μm. In an embodiment, the adhesive layer 615 has a thickness of 550 μm to 800 μm. In an embodiment, the adhesive layer 615 has a thickness of 550 μm to 750 μm. In an embodiment, the adhesive layer 615 has a thickness of 550 μm to 700 μm. In an embodiment, the adhesive layer 615 has a thickness of 550 μm to 650 μm. In an embodiment, the adhesive layer 615 has a thickness of 550 μm to 600 μm.

In an embodiment, the adhesive layer 615 has a thickness of 600 μm to 900 μm.

In an embodiment, the adhesive layer 615 has a thickness of 600 μm to 850 μm. In an embodiment, the adhesive layer 615 has a thickness of 600 μm to 800 μm. In an embodiment, the adhesive layer 615 has a thickness of 600 μm to 750 μm. In an embodiment, the adhesive layer 615 has a thickness of 600 μm to 700 μm. In an embodiment, the adhesive layer 615 has a thickness of 600 μm to 650 μm.

In an embodiment, the adhesive layer 615 has a thickness of 650 μm to 900 μm. In an embodiment, the adhesive layer 615 has a thickness of 650 μm to 850 μm. In an embodiment, the adhesive layer 615 has a thickness of 650 μm to 800 μm. In an embodiment, the adhesive layer 615 has a thickness of 650 μm to 750 μm. In an embodiment, the adhesive layer 615 has a thickness of 650 μm to 700 μm. In an embodiment, the adhesive layer 615 has a thickness of 700 μm to 900 μm. In an embodiment, the adhesive layer 615 has a thickness of 700 μm to 850 μm. In an embodiment, the adhesive layer 615 has a thickness of 700 μm to 800 μm. In an embodiment, the adhesive layer 615 has a thickness of 700 μm to 750 μm. In an embodiment, the adhesive layer 615 has a thickness of 750 μm to 900 μm. In an embodiment, the adhesive layer 615 has a thickness of 750 μm to 850 μm. In an embodiment, the adhesive layer 615 has a thickness of 750 μm to 800 μm. In an embodiment, the adhesive layer 615 has a thickness of 800 μm to 900 μm. In an embodiment, the adhesive layer 615 has a thickness of 800 μm to 850 μm. In an embodiment, the adhesive layer 615 has a thickness of 850 μm to 900 μm.

In an embodiment, the adhesive layer 615 has a thickness of 1 μm. In an embodiment, the adhesive layer 615 has a thickness of 50 μm. In an embodiment, the adhesive layer 615 has a thickness of 100 μm. In an embodiment, the adhesive layer 615 has a thickness of 1 μm. In an embodiment, the adhesive layer 615 has a thickness of 150 μm. In an embodiment, the adhesive layer 615 has a thickness of 200 μm. In an embodiment, the adhesive layer 615 has a thickness of 250 μm. In an embodiment, the adhesive layer 615 has a thickness of 300 μm. In an embodiment, the adhesive layer 615 has a thickness of 350 μm. In an embodiment, the adhesive layer 615 has a thickness of 400 μm. In an embodiment, the adhesive layer 615 has a thickness of 450 μm. In an embodiment, the adhesive layer 615 has a thickness of 500 μm. In an embodiment, the adhesive layer 615 has a thickness of 550 μm. In an embodiment, the adhesive layer 615 has a thickness of 600 μm. In an embodiment, the adhesive layer 615 has a thickness of 650 μm. In an embodiment, the adhesive layer 615 has a thickness of 700 μm. In an embodiment, the adhesive layer 615 has a thickness of 750 μm. In an embodiment, the adhesive layer 615 has a thickness of 800 μm. In an embodiment, the adhesive layer 615 has a thickness of 850 μm. In an embodiment, the adhesive layer 615 has a thickness of 900 μm.

In an embodiment, the polymer layer 613 includes a fluoropolymer. In certain embodiments, the fluoropolymer may be ethylene tetrafluoroethylene (ETFE), fluoropolymer is polyvinylidene fluoride (PVDF), tetrafluoroethylene-hexafluoropropylene copolymers (FEP), and tetrafluoroethylene-hexafluoropropylene-vinylidene fluoride copolymers (THV), polyvinyl fluoride (PVF), or blends thereof. In an embodiment, the frontsheet includes fluoropolymers, acrylics, polyesters, silicones, polycarbonates, or combinations thereof. In other embodiments, the polymer layer 613 includes polyethylene terephthalate (PET), polyethylene naphthalate (PEN), polyetheretherketone (PEEK), polyaryletherketone (PAEK), polyarylate (PAR), polyetherimide (PEI), polyarylsulfone (PAS), polyethersulfone (PES), polyamideimide (PAI), polyphenylsulfone (PPSU), polyolefin, cyclic olefin copolymers (CPCs), or polyimide. In an embodiment, the polymer layer 613 includes a crosslinked polymeric material. In an embodiment, 50% to 99% of the polymer chains of the polymeric material are crosslinked.

In an embodiment, the polymer layer 613 has a thickness of 0.01 mm to 0.5 mm. In another embodiment, the polymer layer 613 has a thickness of 0.01 mm to 0.4 mm. In another embodiment, the polymer layer 613 has a thickness of 0.01 mm to 0.3 mm. In another embodiment, the polymer layer 613 has a thickness of 0.01 mm to 0.2 mm. In another embodiment, the polymer layer 613 has a thickness of 0.01 mm to 0.1 mm. In another embodiment, the polymer layer 613 has a thickness of 0.01 mm to 0.09 mm. In another embodiment, the polymer layer 613 has a thickness of 0.01 mm to 0.08 mm. In another embodiment, the polymer layer 613 has a thickness of 0.01 mm to 0.07 mm. In another embodiment, the polymer layer 613 has a thickness of 0.01 mm to 0.06 mm. In another embodiment, the polymer layer 613 has a thickness of 0.01 mm to 0.05 mm. In another embodiment, the polymer layer 613 has a thickness of 0.01 mm to 0.04 mm. In another embodiment, the polymer layer 613 has a thickness of 0.01 mm to 0.03 mm. In another embodiment, the polymer layer 613 has a thickness of 0.01 mm to 0.02 mm.

In another embodiment, the polymer layer 613 has a thickness of 0.01 mm to 0.4 mm. In another embodiment, the polymer layer 613 has a thickness of 0.02 mm to 0.4 mm. In another embodiment, the polymer layer 613 has a thickness of 0.03 mm to 0.4 mm. In another embodiment, the polymer layer 613 has a thickness of 0.04 mm to 0.4 mm. In another embodiment, the polymer layer 613 has a thickness of 0.05 mm to 0.4 mm. In another embodiment, the polymer layer 613 has a thickness of 0.06 mm to 0.4 mm. In another embodiment, the polymer layer 613 has a thickness of 0.07 mm to 0.4 mm. In another embodiment, the polymer layer 613 has a thickness of 0.08 mm to 0.4 mm. In another embodiment, the polymer layer 613 has a thickness of 0.09 mm to 0.4 mm. In another embodiment, the polymer layer 613 has a thickness of 0.1 mm to 0.4 mm. In another embodiment, the polymer layer 613 has a thickness of 0.15 mm to 0.4 mm. In another embodiment, the polymer layer 613 has a thickness of 0.2 mm to 0.4 mm. In another embodiment, the polymer layer 613 has a thickness of 0.25 mm to 0.4 mm. In another embodiment, the polymer layer 613 has a thickness of 0.3 mm to 0.4 mm. In another embodiment, the polymer layer 613 has a thickness of 0.35 mm to 0.4 mm.

In another embodiment, the polymer layer 613 has a thickness of 0.025 mm to 0.1 mm. In another embodiment, the polymer layer 613 has a thickness of 0.03 mm to 0.1 mm. In another embodiment, the polymer layer 613 has a thickness of 0.035 mm to 0.1 mm. In another embodiment, the polymer layer 613 has a thickness of 0.04 mm to 0.1 mm. In another embodiment, the polymer layer 613 has a thickness of 0.045 mm to 0.1 mm. In another embodiment, the polymer layer 613 has a thickness of 0.05 mm to 0.1 mm. In another embodiment, the polymer layer 613 has a thickness of 0.06 mm to 0.1 mm. In another embodiment, the polymer layer 613 has a thickness of 0.065 mm to 0.1 mm. In another embodiment, the polymer layer 613 has a thickness of 0.07 mm to 0.1 mm. In another embodiment, the polymer layer 613 has a thickness of 0.075 mm to 0.1 mm. In another embodiment, the polymer layer 613 has a thickness of 0.08 mm to 0.1 mm. In another embodiment, the polymer layer 613 has a thickness of 0.085 mm to 0.1 mm. In another embodiment, the polymer layer 613 has a thickness of 0.09 mm to 0.1 mm. In another embodiment, the polymer layer 613 has a thickness of 0.095 mm to 0.1 mm.

In an embodiment, the frontsheet 618 is transparent. In another embodiment, the backsheet 620 is made from glass. In an embodiment, the backsheet 620 is transparent. In another embodiment, the backsheet 620 is non-transparent (opaque). As used herein, the term "transparent" means having a solar weighted transmittance of 80% or greater, and with respect to certain embodiments of the photovoltaic modules, a transparent layer of the photovoltaic module has a solar weighted transmittance of 80% or greater.

In an embodiment, the backsheet 620 includes a flame retardant additive. In some embodiments, the flame retardant additive may be clays, nanoclays, silicas, carbon black, metal hydroxides such as aluminum hydroxide, metal foils, graphite, and combinations thereof.

In an embodiment, the frontsheet 618 has a thickness of 2.5 mm to 4 mm. In another embodiment, the frontsheet 618 has a thickness of 2.5 mm to 3.5 mm. In another embodiment, the frontsheet 618 has a thickness of 2.5 mm to 3 mm. In another embodiment, the frontsheet 618 has a thickness of 3 mm to 4 mm. In another embodiment, the frontsheet 618 has a thickness of 3.5 mm to 4 mm. In another embodiment, the frontsheet 618 has a thickness of 2.6 mm to 3.5 mm. In another embodiment, the frontsheet 618 has a thickness of 2.7 mm to 3.5 mm. In another embodiment, the frontsheet 618 has a thickness of 2.8 mm to 3.5 mm. In another embodiment, the frontsheet 618 has a thickness of 2.9 mm to 3.5 mm. In another embodiment, the frontsheet 618 has a thickness of 3 mm to 3.5 mm. In another embodiment, the frontsheet 618 has a thickness of 3.1 mm to 3.5 mm. In another embodiment, the frontsheet 618 has a thickness of 3.2 mm to 3.5 mm. In another embodiment, the frontsheet 618 has a thickness of 3.3 mm to 3.5 mm. In another embodiment, the frontsheet 618 has a thickness of 3.4 mm to 3.5 mm. In another embodiment, the frontsheet 618 has a thickness of 2.5 mm to 3.4 mm. In another embodiment, the frontsheet 618 has a thickness of 2.5 mm to 3.3 mm. In another embodiment, the frontsheet 618 has a thickness of 2.5 mm to 3.2 mm. In another embodiment, the frontsheet 618 has a thickness of 2.5 mm to 3.1 mm. In another embodiment, the frontsheet 618 has a thickness of 2.5 mm to 2.9 mm. In another embodiment, the frontsheet 618 has a thickness of 2.5 mm to 2.8 mm. In another embodiment, the frontsheet 618 has a thickness of 2.5 mm to 2.7 mm. In another embodiment, the frontsheet 618 has a thickness of 2.5 mm to 2.6 mm.

In another embodiment, the frontsheet 618 has a thickness of 2.5 mm. In another embodiment, the frontsheet 618 has a thickness of 2.6 mm. In another embodiment, the frontsheet 618 has a thickness of 2.7 mm. In another embodiment, the frontsheet 618 has a thickness of 2.8 mm. In another embodiment, the frontsheet 618 has a thickness of 2.9 mm. In another embodiment, the frontsheet 618 has a thickness of 3 mm. In another embodiment, the frontsheet 618 has a thickness of 3.1 mm. In another embodiment, the frontsheet 618 has a thickness of 3.2 mm. In another embodiment, the frontsheet 618 has a thickness of 3.3 mm. In another embodiment, the frontsheet 618 has a thickness of 3.4 mm. In another embodiment, the frontsheet 618 has a thickness of 3.5 mm. In another embodiment, the frontsheet 618 has a thickness of 3.6 mm. In another embodiment, the frontsheet 618 has a thickness of 3.7 mm. In another embodiment, the frontsheet 618 has a thickness of 3.8 mm. In another embodiment, the frontsheet 618 has a thickness of 3.9 mm. In another embodiment, the frontsheet 618 has a thickness of 4 mm.

In an embodiment, the backsheet 620 has a thickness of 10 mil to 100 mil. In an embodiment, the backsheet 620 has a thickness of 10 mil to 90 mil. In an embodiment, the backsheet 620 has a thickness of 10 mil to 80 mil. In an embodiment, the backsheet 620 has a thickness of 10 mil to 70 mil. In an embodiment, the backsheet 620 has a thickness of 10 mil to 60 mil. In an embodiment, the backsheet 620 has a thickness of 10 mil to 50 mil. In an embodiment, the backsheet 620 has a thickness of 10 mil to 40 mil. In an embodiment, the backsheet 620 has a thickness of 10 mil to 30 mil. In an embodiment, the backsheet 620 has a thickness of 10 mil to 20 mil.

In an embodiment, the backsheet 620 has a thickness of 20 mil to 100 mil. In an embodiment, the backsheet 620 has a thickness of 20 mil to 90 mil. In an embodiment, the backsheet 620 has a thickness of 20 mil to 80 mil. In an embodiment, the backsheet 620 has a thickness of 20 mil to 70 mil. In an embodiment, the backsheet 620 has a thickness of 20 mil to 60 mil. In an embodiment, the backsheet 620 has a thickness of 20 mil to 50 mil. In an embodiment, the backsheet 620 has a thickness of 20 mil to 40 mil. In an embodiment, the backsheet 620 has a thickness of 20 mil to 30 mil.

In an embodiment, the backsheet 620 has a thickness of 30 mil to 100 mil. In an embodiment, the backsheet 620 has a thickness of 30 mil to 90 mil. In an embodiment, the backsheet 620 has a thickness of 30 mil to 80 mil. In an embodiment, the backsheet 620 has a thickness of 30 mil to 70 mil. In an embodiment, the backsheet 620 has a thickness of 30 mil to 60 mil. In an embodiment, the backsheet 620 has a thickness of 30 mil to 50 mil. In an embodiment, the backsheet 620 has a thickness of 30 mil to 40 mil.

In an embodiment, the backsheet 620 has a thickness of 40 mil to 100 mil. In an embodiment, the backsheet 620 has a thickness of 40 mil to 90 mil. In an embodiment, the backsheet 620 has a thickness of 40 mil to 80 mil. In an embodiment, the backsheet 620 has a thickness of 40 mil to 70 mil. In an embodiment, the backsheet 620 has a thickness of 40 mil to 60 mil. In an embodiment, the backsheet 620 has a thickness of 40 mil to 50 mil. In an embodiment, the backsheet 620 has a thickness of 50 mil to 100 mil. In an embodiment, the backsheet 620 has a thickness of 50 mil to 90 mil. In an embodiment, the backsheet 620 has a thickness of 50 mil to 80 mil. In an embodiment, the backsheet 620 has a thickness of 50 mil to 70 mil. In an embodiment, the backsheet 620 has a thickness of 50 mil to 60 mil.

In an embodiment, the backsheet 620 has a thickness of 60 mil to 100 mil. In an embodiment, the backsheet 620 has a thickness of 60 mil to 90 mil. In an embodiment, the backsheet 620 has a thickness of 60 mil to 80 mil. In an embodiment, the backsheet 620 has a thickness of 60 mil to 70 mil. In an embodiment, the backsheet 620 has a thickness of 70 mil to 100 mil. In an embodiment, the backsheet 620 has a thickness of 70 mil to 90 mil. In an embodiment, the backsheet 620 has a thickness of 70 mil to 80 mil. In an embodiment, the backsheet 620 has a thickness of 80 mil to 100 mil. In an embodiment, the backsheet 620 has a thickness of 80 mil to 90 mil. In an embodiment, the backsheet 620 has a thickness of 90 mil to 100 mil.

In an embodiment, the backsheet 620 has a thickness of 10 mil. In an embodiment, the backsheet 620 has a thickness of 20 mil. In an embodiment, the backsheet 620 has a thickness of 30 mil. In an embodiment, the backsheet 620 has a thickness of 40 mil. In an embodiment, the backsheet 620 has a thickness of 50 mil. In an embodiment, the backsheet 620 has a thickness of 60 mil. In an embodiment, the backsheet 620 has a thickness of 10 mil. In an embodiment, the backsheet 620 has a thickness of 70 mil. In an embodiment, the backsheet 620 has a thickness of 80 mil. In an embodiment, the backsheet 620 has a thickness of 90 mil. In an embodiment, the backsheet 620 has a thickness of 100 mil.

In an embodiment, the frontsheet 618 and the backsheet 620 are laminated. In an embodiment, the backsheet 620 is ultrasonically welded to the frontsheet 618. In an embodiment, the backsheet 620 is heat welded to the frontsheet 618. In an embodiment, the backsheet 620 is thermally bonded to the frontsheet 618.

Still referring to FIGS. 6A and 6B, in an embodiment, the photovoltaic module 600 includes a first electrical bussing 622 located proximate to the first end 602, and a second electrical bussing 624 located proximate to the second end 604. In an embodiment, the first electrical bussing 622 extends proximately from the first side 606 and proximately to the second side 608. In an embodiment, the second electrical bussing 624 extends proximately from the first side 606 and proximately to the second side 608. In an embodiment, the first electrical bussing 622 and the second electrical bussing 624 are encapsulated within the encapsulant 612.

In an embodiment, each of the first electrical bussing 622 and the second electrical bussing 624 are made of an electrically conductive material. In an embodiment, each of the first electrical bussing 622 and the second electrical bussing 624 is made of copper. In an embodiment, each of the first electrical bussing 622 and the second electrical bussing 624 is made of aluminum. In an embodiment, a first solder pad 626 extends outwardly from an upper surface 619 of the frontsheet 618 and is electrically connected to the first electrical bussing 622. In an embodiment, a second solder pad 628 extends outwardly from the upper surface 619 of the frontsheet 618 and is electrically connected to the second electrical bussing 624.

Figure 6D:
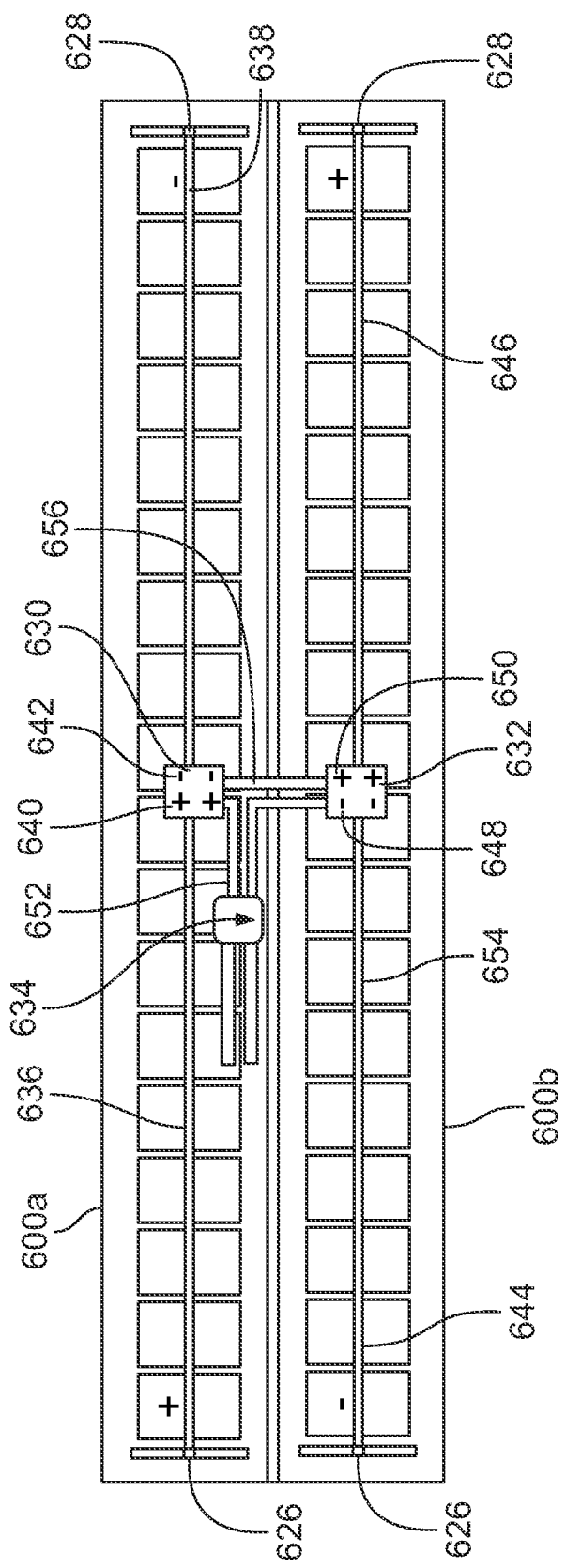

Referring to FIGS. 6C and 6D, in an embodiment, a first photovoltaic module 600a is attached to a second photovoltaic module 600b. In an embodiment, each of the first photovoltaic module 600a and the second photovoltaic module 600b includes the same features and structure as the photovoltaic module 600. In an embodiment, the second side 608 of the first photovoltaic module 600a is attached to the first side 606 of the second photovoltaic module 600b. In an embodiment, the second surface 605 of the first photovoltaic module 600a proximate to the second side 608 thereof is attached to the first surface 603 of the second photovoltaic module 600b proximate to the first side 606 thereof. In an embodiment, backsheet 620 of the first photovoltaic module 600a proximate to the second side 608 thereof is attached to the frontsheet 618 of the second photovoltaic module 600b proximate to the first side 606 thereof. In an embodiment, the first photovoltaic module 600a is ultrasonically welded to the second photovoltaic module 600b. In an embodiment, the first photovoltaic module 600a is heat welded to the second photovoltaic module 600b. In an embodiment, the first photovoltaic module 600a is thermally bonded to the second photovoltaic module 600b. In an embodiment, the first photovoltaic module 600a is attached to the second photovoltaic module 600b by an adhesive 601. In an embodiment, the first photovoltaic module 600a is attached to the second photovoltaic module 600b by an adhesive tape. In an embodiment, the first photovoltaic module 600a is attached to the second photovoltaic module 600b by butyl tape.

In an embodiment, the first photovoltaic module 600a is laminated. In an embodiment, the second photovoltaic module 600b is laminated. In an embodiment, the first photovoltaic module 600a is attached to the second photovoltaic module 600b after each of them is laminated. In another embodiment, the first photovoltaic module 600a and the second photovoltaic module 600b are attached to one another during the lamination of each of the first photovoltaic module 600a and the second photovoltaic module 600b. In an embodiment, the first photovoltaic module 600a is laminated, and subsequently the first photovoltaic module 600a is attached to the second photovoltaic module 600b during lamination of the second photovoltaic module 600b. In an embodiment, the second photovoltaic module 600b is laminated, and subsequently the second photovoltaic module 600b is attached to the first photovoltaic module 600a during lamination of the first photovoltaic module 600a.

In an embodiment, a method comprising the steps of:
(i) laminating the first photovoltaic module 600a;
(ii) laminating the second photovoltaic module 600b; and
(iii) attaching the first photovoltaic module 600a and the second photovoltaic module 600b to one another.

In an embodiment, a method comprising the steps of:
(i) obtaining an unlaminated first photovoltaic module 600a;
(ii) obtaining an unlaminated second photovoltaic module 600b;
(iii) laminating the first photovoltaic module 600a and the second photovoltaic module 600b; and
(iv) attaching the first photovoltaic module 600a to the second photovoltaic module 600b during the laminating step.

In an embodiment, a method comprising the steps of:
(i) laminating the first photovoltaic module 600a;

(ii) obtaining an unlaminated second photovoltaic module 600*b*;

(iii) laminating the second photovoltaic module 600*b*; and (iv) attaching the first photovoltaic module 600*a* to the second photovoltaic module 600*b* during the lamination of the second photovoltaic module 600*b* step.

In an embodiment, a method comprising the steps of:

(i) laminating the second photovoltaic module 600*b*;

(ii) obtaining an unlaminated first photovoltaic module 600*a*;

(iii) laminating the first photovoltaic module 600*a*; and (iv) attaching the first photovoltaic module 600*a* to the second photovoltaic module 600*b* during the lamination of the first photovoltaic module 600*a* step.

In an embodiment, the first solder pad 626 of the first photovoltaic module 600*a* is a positive terminal, while the second solder pad 628 of the first photovoltaic module 600*a* is a negative terminal. In an embodiment, the first solder pad 626 of the second photovoltaic module 600*b* is a negative terminal, while the second solder pad 628 of the second photovoltaic module 600*b* is a positive terminal.

In another embodiment, the first solder pad 626 of the first photovoltaic module 600*a* is a negative terminal, while the second solder pad 628 of the first photovoltaic module 600*a* is a positive terminal. In an embodiment, the first solder pad 626 of the second photovoltaic module 600*b* is a positive terminal, while the second solder pad 628 of the second photovoltaic module 600*b* is a negative terminal.

In an embodiment, the first solder pad 626 of the first photovoltaic module 600*a* is a positive terminal, while the second solder pad 628 of the first photovoltaic module 600*a* is a negative terminal. In an embodiment, the first solder pad 626 of the second photovoltaic module 600*b* is a positive terminal, while the second solder pad 628 of the second photovoltaic module 600*b* is a negative terminal.

In another embodiment, the first solder pad 626 of the first photovoltaic module 600*a* is a negative terminal, while the second solder pad 628 of the first photovoltaic module 600*a* is a positive terminal. In an embodiment, the first solder pad 626 of the second photovoltaic module 600*b* is a negative terminal, while the second solder pad 628 of the second photovoltaic module 600*b* is a positive terminal.

Referring to FIG. 6D, in an embodiment, the first photovoltaic module 600*a* includes a first power optimizer 630. In an embodiment, the second photovoltaic module 600*b* includes a second power optimizer 632. In an embodiment, the first power optimizer 630 is encapsulated by the encapsulant 612 of the first photovoltaic module 600*a*. In an embodiment, the second power optimizer 632 is encapsulated by the encapsulant 612 of the second photovoltaic module 600*b*. In an embodiment, the first photovoltaic module 600*a* includes a junction box 634. In an embodiment, the junction box 634 is encapsulated by the encapsulant 612 of the first photovoltaic module 600*a*. In another embodiment, the second photovoltaic module 600*b* includes the junction box 634. In an embodiment, the junction box 634 is encapsulated by the encapsulant 612 of the second photovoltaic module 600*b*.

In an embodiment, one end of a third electrical bussing 636 is electrically connected to the first solder pad 626 of the first photovoltaic module 600*a* and an opposite end of the third electrical bussing 636 is electrically connected to a first terminal 640 of the first power optimizer 630. In an embodiment, one end of a fourth electrical bussing 638 is electrically connected to the second solder pad 628 of the first photovoltaic module 600*a* and an opposite end of the fourth electrical bussing 638 is electrically connected to a second terminal 642 of the first power optimizer 630. In an embodiment, the first terminal 640 is a positive terminal and the second terminal 642 is a negative terminal. In another embodiment, the first terminal 640 is a negative terminal and the second terminal 642 is a positive terminal.

In an embodiment, one end of a fifth electrical bussing 644 is electrically connected to the first solder pad 626 of the second photovoltaic module 600*b* and an opposite end of the fifth electrical bussing 644 is electrically connected to a first terminal 648 of the second power optimizer 632. In an embodiment, one end of a sixth electrical bussing 646 is electrically connected to the second solder pad 628 of the second photovoltaic module 600*b* and an opposite end of the sixth electrical bussing 646 is electrically connected to a second terminal 650 of the second power optimizer 632. In an embodiment, the first terminal 648 is a negative terminal and the second terminal 650 is a positive terminal. In an embodiment, the first terminal 648 is a positive terminal and the second terminal 650 is a positive terminal.

In an embodiment, one end of a seventh electrical bussing 652 is electrically connected to the first terminal 640 of the first power optimizer 630 and an opposite end of the seventh electrical bussing 652 is electrically connected to the junction box 634. In an embodiment, one end of an eighth electrical bussing 654 is electrically connected to the first terminal 648 of the second power optimizer 632 and an opposite end of the eighth electrical bussing 654 is electrically connected to the junction box 634. In an embodiment, one end of a ninth electrical bussing 656 is electrically connected to the second terminal 642 of the first power optimizer 630 and an opposite end of the ninth electrical bussing 656 is electrically connected to the second terminal 650 of the second power optimizer 632.

In an embodiment, each of the first and second photovoltaic modules 600*a*, 600*b* is adapted to be affixed to a roof deck by a plurality of fasteners. In an embodiment, the plurality of fasteners includes a plurality of nails. In another embodiment, the plurality of fasteners includes a plurality of screws. In another embodiment, the plurality of fasteners includes a plurality of staples. In another embodiment, the plurality of fasteners includes a plurality of rivets. In another embodiment, each of the first and second photovoltaic modules 600*a*, 600*b* is adapted to be affixed to the roof deck by an adhesive.

In an embodiment, more than two of the photovoltaic module 600 may be attached to one another in a manner as described above with respect to the first and second photovoltaic modules 600*a*, 600*b*. For example, a third one of the photovoltaic module 600 may be attached to either the first and second photovoltaic modules 600*a*, 600*b*.

Referring to FIGS. 7A through 7D, in an embodiment, a photovoltaic module 700 includes at least one solar cell 710, an encapsulant 712 encapsulating the at least one solar cell 710, a frontsheet 718 juxtaposed with a first surface 714 of the encapsulant 712, and a backsheet 720 juxtaposed with a second surface 716 of the encapsulant 712. In an embodiment, the photovoltaic module 700 includes a structure and features similar to those of the photovoltaic module 600, but includes certain differences as described hereinafter.

In an embodiment, the photovoltaic module 700 includes a first electrical bussing 722 located proximate to a first end 702 thereof, and a second electrical bussing 724 located proximate to a second end 704 thereof. In an embodiment, the first electrical bussing 722 extends proximately from a first side 706 and proximately to a second side 708. In an embodiment, the first electrical bussing 722 and the second electrical bussing 724 are encapsulated within the encapsulant 712. In an embodiment, a first solder pad 726 extends outwardly from an upper surface 719 of the frontsheet 718 and is electrically connected to the first electrical bussing 722. In an embodiment, a second solder pad 728 extends outwardly from the upper surface 719 of the frontsheet 718 and is electrically connected to the second electrical bussing 724. In an embodiment, each of the first solder pad 726 and the second solder pad 728 is located proximate to the first side 706. In an embodiment, a third electrical bussing 725 includes a first end 727 and second end 729 opposite the first end 727. In an embodiment, the first end 727 is located proximate to the first end 702 and the second end 729 is located proximate to the second end 704. In an embodiment, the third electrical bussing 725 is located proximate to the first side 706. In another embodiment, the third electrical bussing 725 is located proximate to the second side 708. In an embodiment, a third solder pad 731 extends outwardly from the upper surface 719 of the frontsheet 718 and is electrically connected to the first end 727 of the third electrical bussing 725. In an embodiment, a fourth solder pad 733 extends outwardly from the upper surface 719 of the frontsheet 718 and is electrically connected to the second end 729 of the third electrical bussing 725. In an embodiment, the third solder pad 731 is located proximate to the first solder pad 726, while the fourth solder pad 733 is located proximate to the second solder pad 728.

Referring to FIGS. 7C through 7E, in an embodiment, a first photovoltaic module 700a is attached to a second photovoltaic module 700b. In an embodiment, the second end 704 of the first photovoltaic module 700a is attached to the first end 702 of the second photovoltaic module 700b. In an embodiment, a second surface 705 of the first photovoltaic module 700a proximate to the second end 704 of the first photovoltaic module 700a is attached to a first surface 703 of the second photovoltaic module 700b proximate to the first end 702 of the second photovoltaic module 700b. In an embodiment, the first photovoltaic module 700a is ultrasonically welded to the second photovoltaic module 700b. In an embodiment, the first photovoltaic module 700a is heat welded to the second photovoltaic module 700b. In an embodiment, the first photovoltaic module 700a is thermally bonded to the second photovoltaic module 700b. In an embodiment, the first photovoltaic module 700a is attached to the second photovoltaic module 700b by an adhesive 701. In an embodiment, the first photovoltaic module 700a is attached to the second photovoltaic module 700b by an adhesive tape. In an embodiment, the first photovoltaic module 700a is attached to the second photovoltaic module 700b by butyl tape.

In an embodiment, the first photovoltaic module 700a is laminated. In an embodiment, the second photovoltaic module 700b is laminated. In an embodiment, the first photovoltaic module 700a is attached to the second photovoltaic module 700b after each of them is laminated. In another embodiment, the first photovoltaic module 700a and the second photovoltaic module 700b are attached to one another during the lamination of each of the first photovoltaic module 700a and the second photovoltaic module 700b. In an embodiment, the first photovoltaic module 700a is laminated, and subsequently the first photovoltaic module 700a is attached to the second photovoltaic module 700b during lamination of the second photovoltaic module 700b. In an embodiment, the second photovoltaic module 700b is laminated, and subsequently the second photovoltaic module 700b is attached to the first photovoltaic module 700a during lamination of the first photovoltaic module 700a.

In an embodiment, a method comprising the steps of:

(i) laminating the first photovoltaic module 700a;

(ii) laminating the second photovoltaic module 700b; and (iii) attached the first photovoltaic module 700a and the second photovoltaic module 700b to one another.

In an embodiment, a method comprising the steps of:

(i) obtaining an unlaminated first photovoltaic module 700a;

(ii) obtaining an unlaminated second photovoltaic module 700b;

(iii) laminating the first photovoltaic module 700a and the second photovoltaic module 700b; and (iv) attaching the first photovoltaic module 700a to the second photovoltaic module 700b during the laminating step.

In an embodiment, a method comprising the steps of:

(i) laminating the first photovoltaic module 700a;

(ii) obtaining an unlaminated second photovoltaic module 700b;

(iii) laminating the second photovoltaic module 700b; and (iv) attaching the first photovoltaic module 700a to the second photovoltaic module 600b during the lamination of the second photovoltaic module 700b step.

In an embodiment, a method comprising the steps of:

(i) laminating the second photovoltaic module 700b;

(ii) obtaining an unlaminated first photovoltaic module 700a;

(iii) laminating the first photovoltaic module 700a; and (iv) attaching the first photovoltaic module 700a to the second photovoltaic module 700b during the lamination of the first photovoltaic module 700a step.

In an embodiment, each of the first solder pad 726 and the third solder pad 731 of each of the first photovoltaic module 700a and the second photovoltaic module 700b is a positive terminal, while each of the second solder pad 728 and the fourth solder pad 733 of each of the first photovoltaic module 700a and the second photovoltaic module 700b is a negative terminal. In another embodiment, each of the first solder pad 726 and the third solder pad 731 of each of the first photovoltaic module 700a and the second photovoltaic module 700b is a negative terminal, while each of the second solder pad 728 and the fourth solder pad 733 of each of the first photovoltaic module 700a and the second photovoltaic module 700b is a positive terminal.

In an embodiment, one end of a first bridge 735 is electrically connected to the second solder pad 728 of the first photovoltaic module 700a and an opposite end of the first bridge 735 is electrically connected to the first solder pad 726 of the second photovoltaic module 700b. In an embodiment, one end of a second bridge 737 is electrically connected to the fourth solder pad 733 of the first photovoltaic module 700a and an opposite end of the second bridge 737 is electrically connected to the third solder pad 731 of the second photovoltaic module 700b.

In an embodiment, at least one fold line 755 is located intermediate the first photovoltaic module 700a and the second photovoltaic module 700b. In an embodiment, the connected first photovoltaic module 700a and second photovoltaic module 700b are foldable relative to one another at the at least one fold line 755. In other embodiments, additional fold lines may be incorporated.

In an embodiment, each of the first bridge 735 and the second bridge 737 is made from a flexible material. In an embodiment, each of the first bridge 735 and the second bridge 737 is made from copper. In an embodiment, each of the first bridge 735 and the second bridge 737 is made from aluminum.

Referring to FIG. 7E, in an embodiment, a power optimizer 730 is electrically connected to the first solder pad 726 of the first photovoltaic module 700a and the third soldering paid 731 of the first photovoltaic module 700a. In an embodiment, a junction box 734 is electrically connected to the power optimizer 730. In an embodiment, a jumper 739 electrically connects the second solder pad 728 of the second photovoltaic module 700b and the fourth solder pad 733 of the second photovoltaic module 700b.

In another embodiment, the power optimizer 730 is electrically connected to the second solder pad 728 of the second photovoltaic module 700b and the fourth soldering paid 733 of the second photovoltaic module 700b. In an embodiment, the junction box 734 is electrically connected to the power optimizer 730. In another embodiment, the jumper 739 electrically connects the first solder pad 726 of the first photovoltaic module 700a and the third solder pad 731 of the first photovoltaic module 700a.

Still referring to FIGS. 7A through 7C, in an embodiment, each of the first bridge 735 and the second bridge 737 extends inwardly (i.e., towards the second sides 708) such that it is located within the boundaries of and intermediate the first side 706 and the second side 708 of each of the first photovoltaic module 700a and the second photovoltaic module 700b.

Figure 8A:
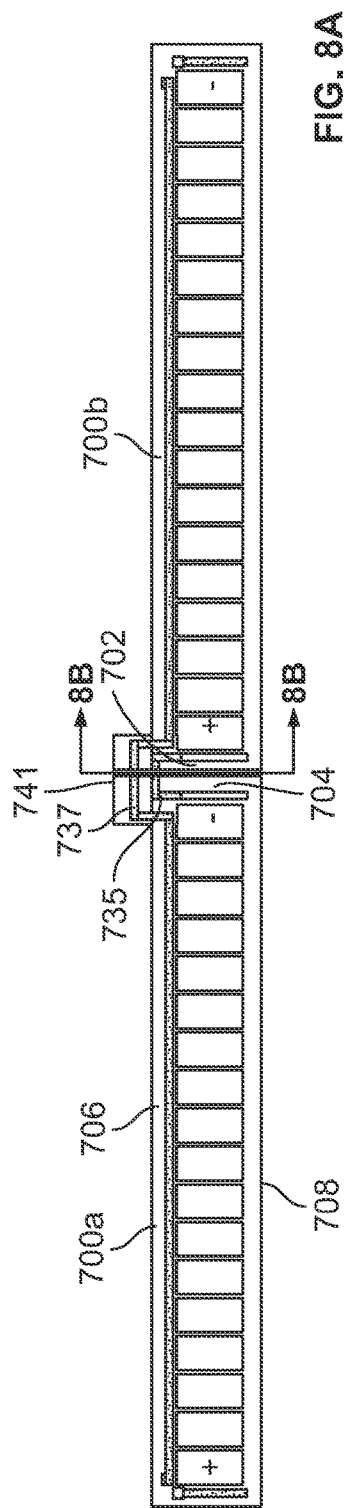
FIGS. 8A through 8D show another embodiment of the first and second photovoltaic modules shown in FIG. 7A attached to one another.
Figure 8B:
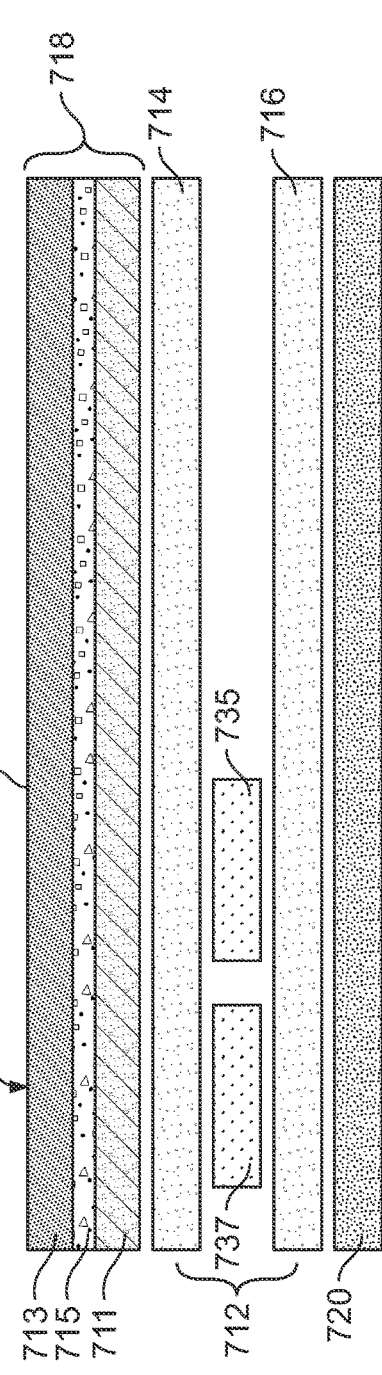
Figure 8C:
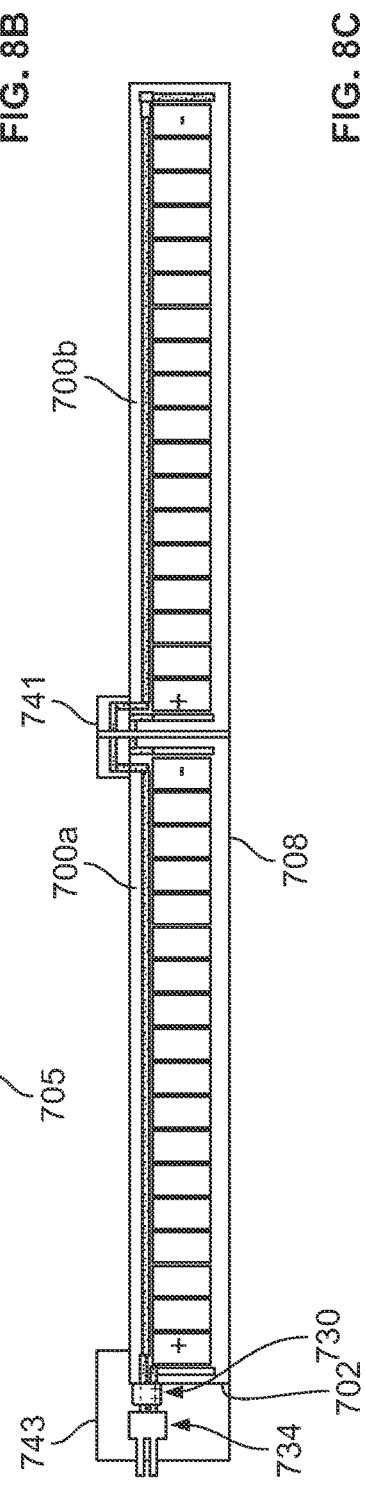

Referring to FIGS. 8A through 8C, in another embodiment, each of the first bridge 735 and the second bridge 737 is inverted and extends outwardly (i.e., towards the first side 706). In an embodiment, the second bridge 737 extends outwardly from the first side 706 of each of the first photovoltaic module 700a and the second photovoltaic module 700b. In an embodiment, a flap 741 is located intermediate the second end 704 of the first photovoltaic module 700a and the first end 702 of the second photovoltaic module 700b. In an embodiment, the flap 741 is attached to the backsheet 720. In an embodiment, the second bridge 737 is juxtaposed with the flap 741. In an embodiment, the flap 741 includes a polymer. In an embodiment, the flap includes thermoplastic polyolefin (TPO). In an embodiment, the flap 741 is made from the same material as the backsheet 720.

In an embodiment, the connected first and second photovoltaic modules 700a, 700b is adapted to bend in three degrees of freedom (i.e., X direction, Y direction and Z direction). In a embodiment, more than two of the photovoltaic module 700 may be attached to one another in a manner as described above with respect to the first and second photovoltaic modules 700a, 700b. For example, a third one of the photovoltaic module 700 may be attached to either the first and second photovoltaic modules 700a, 700b.

Referring to FIG. 8C, in an embodiment, a side flap 743 is located at the first end 702 of the first photovoltaic module 700a. In an embodiment, the side flap 743 is attached to the backsheet 720. In an embodiment, the power optimizer 730 is juxtaposed with the side flap 743. In an embodiment, the junction box 734 is juxtaposed with the side flap 743. In another embodiment, the side flap 743 is located at the second end 704 of the second photovoltaic module 700b. In an embodiment, the side flap 743 includes a polymer. In an embodiment, the side flap 743 includes thermoplastic polyolefin (TPO). In an embodiment, the side flap 743 is made from the same material as the backsheet 720.

Figure 8D:
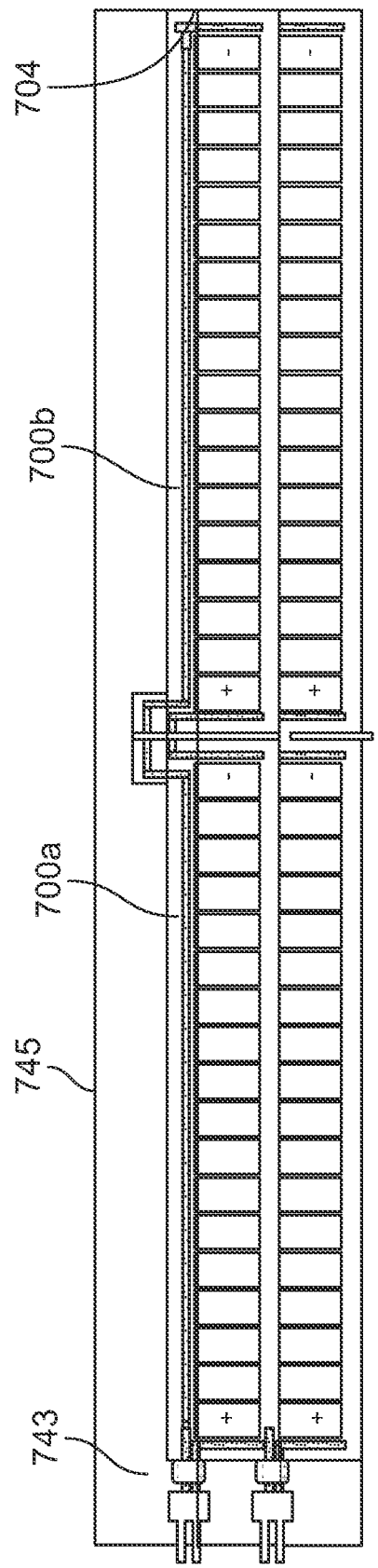
Figure 9A:
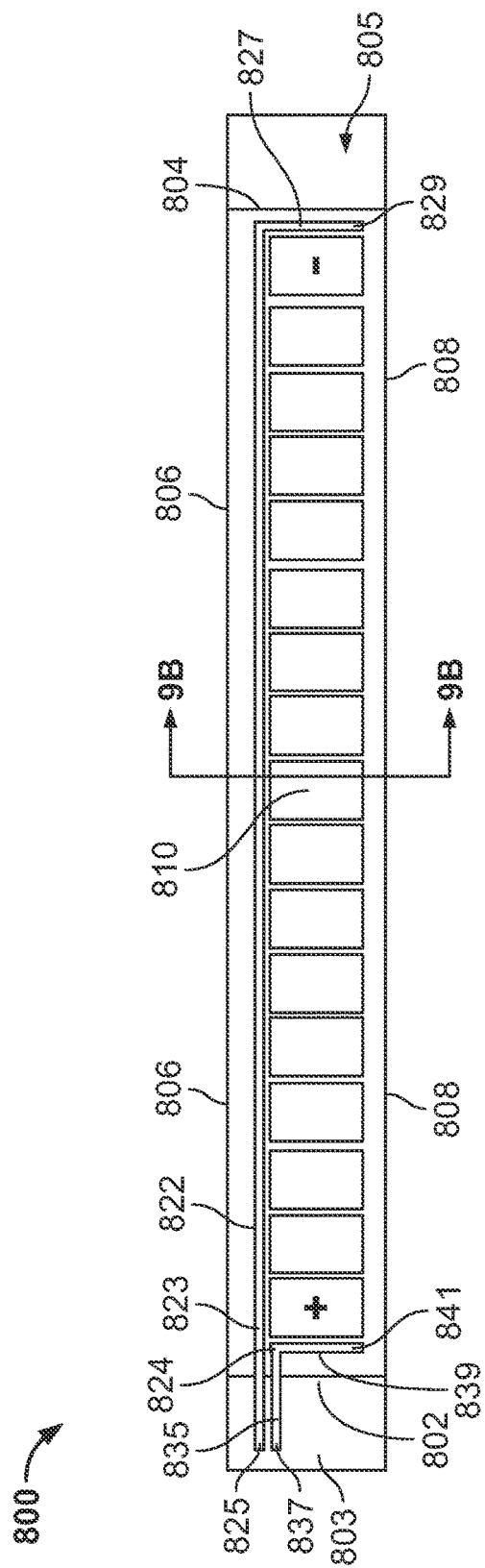
FIG. 9A shows a top plan view of an embodiment of a photovoltaic module.
Figure 9B:
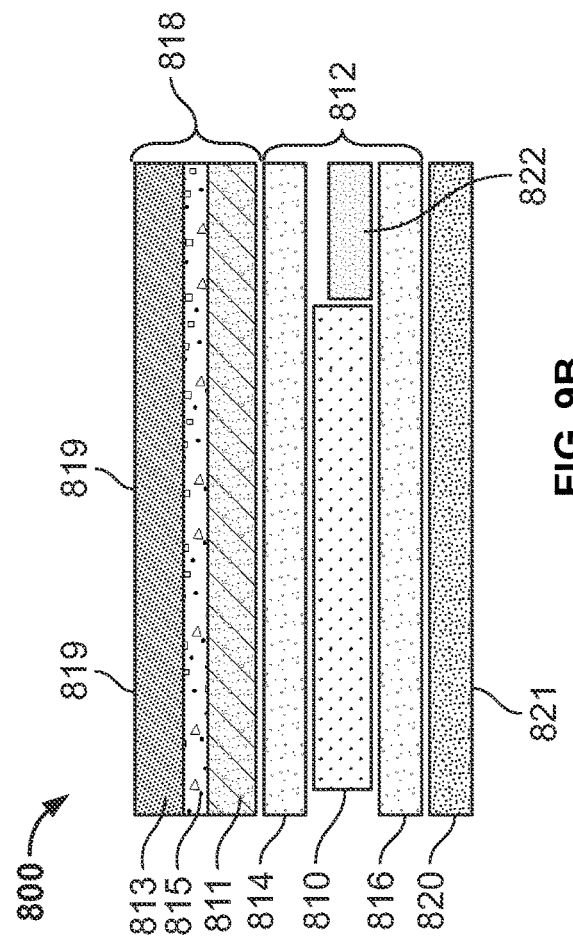
FIG. 9B is a cross-sectional view, taken along line 9B-9B and looking in the direction of the arrows, of the photovoltaic module of FIG. 9A.

Referring to FIG. 8D, in an embodiment, a headlap 745 extends from the side flap 743 to the second end 704 of the second photovoltaic module 700b. In an embodiment, one pair of the first and second photovoltaic modules 700a, 700b overlap the headlap 745 of another pair of the first and second photovoltaic modules 700a, 700b. In an embodiment, the headlap 745 includes a polymer. In an embodiment, the headlap 745 includes thermoplastic polyolefin (TPO). In an embodiment, the headlap 745 is made from the same material as the backsheet 720.

Referring to FIGS. 9A through 9D, in an embodiment, a photovoltaic module 800 includes at least one solar cell 810, an encapsulant 812 encapsulating the at least one solar cell 810, a frontsheet 818 juxtaposed with a first surface 814 of the encapsulant 812, and a backsheet 820 juxtaposed with a second surface 816 of the encapsulant 812. In an embodiment, the photovoltaic module 800 includes a structure and features similar to those of the photovoltaic module 700, but includes certain differences as described hereinafter.

In an embodiment, the photovoltaic module 800 includes a first side flap 803 located at a first end 802 thereof, and a second side flap 805 located at a second end 804 thereof. In an embodiment, each of the first and second side flaps 803, 805 includes a polymer. In an embodiment, each of the first and second side flaps 803, 805 includes thermoplastic polyolefin (TPO). In an embodiment, each of the first and second side flaps 803, 805 is made from the same material as the backsheet 820. In an embodiment, a first electrical bussing 822 includes a first portion 823 having a first end 825 and a second portion 827 having a second end 829. In an embodiment, the first end 825 is juxtaposed with the first side flap 803, and second end 829 is located proximate to the second side flap 805. In an embodiment, the first portion 823 is located proximate to a first side 806 of the photovoltaic module 800. In an embodiment, the second end 829 is located proximate to a second side 808. In an embodiment, the first electrical bussing 822 runs adjacent to the at least one solar cell 810. In an embodiment, the first portion 823 and the second portion 827 are substantially perpendicular to one another.

In an embodiment, a second electrical bussing 824 includes a first portion 835 having a first end 837 and a second portion 839 having a second end 841. In an embodiment, the first end 837 is juxtaposed with the first side flap 803, while the second end 841 is located proximate to the second side 808. In an embodiment, the first portion 835 and the second portion 839 are substantially perpendicular to one another. In an embodiment, the first portion 835 is substantially parallel to the first portion 823. In an embodiment, the second portion 839 runs adjacent to the at least one solar cell 710. In an embodiment, each of the first ends 825, 837 is a positive terminal, while each of the second ends 829, 841 is a negative terminal. It should be understood that the configuration of the photovoltaic module 800 may be inverted, such that the first ends 825, 837 of the first and second electrical bussings 822, 824 are juxtaposed with the second side flap 805. In an embodiment, more than two rows of the photovoltaic modules 700a, 700b may be attached to one another in a manner as described above with respect to the first and second photovoltaic modules 700a, 700b. For example, a third row, fourth row, fifth row, six row, etc. of the photovoltaic modules 700a, 700b may be included.

Referring to FIG. 9C, a first photovoltaic module 800a is attached to a second photovoltaic module 800b. In an embodiment, the second side 808 of the first photovoltaic module 800a is attached to the first side 806 of the second photovoltaic module 800b. In an embodiment, a second surface 821 of the first photovoltaic module 800a proximate to the second side 808 thereof is attached to a first surface 819 of the second photovoltaic module 800b proximate to the first side 806 thereof. In an embodiment, a backsheet 820 of the first photovoltaic module 800a proximate to the second side 808 thereof is attached to the frontsheet 818 of the second photovoltaic module 800b proximate to the first side 806 thereof. In certain embodiments, the first photovoltaic module 800a is attached to a second photovoltaic module 800b as described above with respect to the first and second photovoltaic modules 600a, 600b.

Referring to FIG. 9D, in an embodiment, a first power optimizer 830 is electrically connected to the first ends 825, 837 of the first and second electrical bussings 822, 824 of the first photovoltaic module 800a. In an embodiment, the first power optimizer 830 is juxtaposed with the first side flap 803 of the first photovoltaic module 800a. In an embodiment, a first junction box 834a is electrically connected to the first ends 825, 837 of the first and second electrical bussings 822, 824 of the first photovoltaic module 800a. In an embodiment, the first junction box 834a is juxtaposed with the first side flap 803. In an embodiment, a second power optimizer 832 is electrically connected to the first ends 825, 837 of the first and second electrical bussings 822, 824 of the second photovoltaic module 800b. In an embodiment, the second power optimizer 832 is juxtaposed with the first side flap 803 of the first photovoltaic module 800a. In an embodiment, a second junction box 834b is electrically connected to the first ends 825, 837 of the first and second electrical bussings 822, 824 of the second photovoltaic module 800b. In an embodiment, the second junction box 834b is juxtaposed with the first side flap 803 of the second photovoltaic module 800b. In an embodiment, the first junction box 834a is electrically connected to the second junction box 834b. Once again, it should be understood that the configuration may be inverted such that the such that the first ends 825, 837 of the first and second electrical bussings 822, 824 are juxtaposed with the second side flap 805, and the first and second power optimizers 830, 832 and the junction boxes 834a, 834b are juxtaposed with the second side flap 805, of each of the first and second photovoltaic modules 800a, 800b, respectively. In an embodiment, a headlap may be attached to the photovoltaic modules 800a, 800b.

What is claimed is:

1. A system, comprising:
    a first photovoltaic module portion and a second photovoltaic module portion, each of the first photovoltaic module portion and the second photovoltaic module portion includes
        a first end, a second end opposite the first end, a first side extending from the first end to the second end, a second side opposite the first side and extending from the first end to the second end, a first surface and a second surface opposite the first surface;
        at least one solar cell;
        an encapsulant encapsulating the at least one solar cell, wherein the encapsulant includes a first surface and a second surface opposite the first surface of the encapsulant;
        a frontsheet juxtaposed with the first surface of the encapsulant, and
        a backsheet juxtaposed with the second surface of the encapsulant;
    a first electrical bussing portion located proximate to the first end of the first photovoltaic module portion and extending proximate the first side of the first photovoltaic module portion to proximate the second side of the first photovoltaic module portion;
    a second electrical bussing portion located proximate to the second end of the second photovoltaic module portion and extending proximate the first side of the second photovoltaic module portion to proximate the second side of the second photovoltaic module portion;
    a third electrical bussing portion extending along the first side of the first photovoltaic module portion, the third bussing portion extending between the first and second ends of the first photovoltaic module portion;
    a fourth electrical busing portion extending along the first side of the second photovoltaic module portion, the fourth bussing portion extending between the first and second ends of the second photovoltaic module portion;
    a first bridge:
        electrically connecting
            the first electrical bussing portion of the first photovoltaic module portion, and
            the second electrical bussing portion of the second photovoltaic module portion; and
        encapsulated by the encapsulant that also encapsulates the at least one solar cell of the first and second photovoltaic module portions;
    a second bridge:
        electrically connecting
            the third electrical bussing portion of the first photovoltaic module portion, and
            the fourth electrical bussing portion of the second photovoltaic module portion; and
        encapsulated by the encapsulant that also encapsulates the at least one solar cell of the first and second photovoltaic module portions and the first bridge,
            wherein the first and second encapsulated bridges are configured to bend so as to result in the first and second photovoltaic modules folding relative to each other; and
    at least one side flap located at at least one of the first end and the second end of the second photovoltaic module portion.

2. The system of claim 1, wherein the first photovoltaic module portion is ultrasonically welded to the second photovoltaic module portion.

3. The system of claim 1, wherein the first photovoltaic module portion is heat welded to the second photovoltaic module portion.

4. The system of claim 1, wherein the first photovoltaic module portion is thermally bonded to the second photovoltaic module portion.

5. The system of claim 1, wherein the first photovoltaic module portion is attached to the second photovoltaic module portion by an adhesive.

6. The system of claim 1, wherein the first photovoltaic module portion is attached to the second photovoltaic module portion by an adhesive tape.

7. The system of claim 1, further comprising a power optimizer and a junction box electrically connected to the power optimizer.

* * * * *